(12) United States Patent
Ito et al.

(10) Patent No.: US 7,349,250 B2
(45) Date of Patent: Mar. 25, 2008

(54) SEMICONDUCTOR DEVICE

(75) Inventors: Fumitoshi Ito, Hamura (JP); Yoshiyuki Kawashima, Hitachinaka (JP); Takeshi Sakai, Hitachinaka (JP); Yasushi Ishii, Mito (JP); Yasuhiro Kanamaru, Hitachinaka (JP); Takashi Hashimoto, Iruma (JP); Makoto Mizuno, Tokyo (JP); Kousuke Okuyama, Kawagoe (JP); Yukiko Manabe, Yokohama (JP)

(73) Assignee: Renesas Technology Corp., Tokyo (JP)

( * ) Notice: Subject to any disclaimer, the term of this patent is extended or adjusted under 35 U.S.C. 154(b) by 74 days.

(21) Appl. No.: 11/181,721

(22) Filed: Jul. 15, 2005

(65) Prior Publication Data

US 2006/0077713 A1  Apr. 13, 2006

(30) Foreign Application Priority Data

Sep. 29, 2004  (JP) .............................. 2004-284123

(51) Int. Cl.
*G11C 11/34* (2006.01)
(52) U.S. Cl. .................................. 365/185.05; 257/326
(58) Field of Classification Search ................ 257/326; 365/63, 185.05
See application file for complete search history.

(56) References Cited

U.S. PATENT DOCUMENTS

2002/0113257 A1* 8/2002 Osabe et al. ................. 257/296

FOREIGN PATENT DOCUMENTS

JP       2002-164449      7/2002

* cited by examiner

*Primary Examiner*—Anh Phung
*Assistant Examiner*—Michael Lulis
(74) *Attorney, Agent, or Firm*—Miles & Stockbridge P.C.

(57) ABSTRACT

The degree of integration and the number of rewriting of a semiconductor device having a nonvolatile memory element are improved. A first MONOS nonvolatile-memory-element and a second MONOS nonvolatile-memory-element having a large gate width compared with the first MONOS nonvolatile-memory-element are mounted together on the same substrate, and the first MONOS nonvolatile-memory-element is used for storing program data which is scarcely rewritten, and the second MONOS nonvolatile-memory-element is used for storing processed data which is frequently rewritten.

19 Claims, 29 Drawing Sheets

SEMICONDUCTOR DEVICE

CROSS-REFERENCE TO RELATED APPLICATION

The present application claims priority from Japanese patent application No 2004-284123 filed on Sep. 29, 2004, the content of which is hereby incorporated by reference into this application.

BACKGROUND OF THE INVENTION

1. Field of the Invention

The present invention relates to a semiconductor device, particularly relates to a technique which is effectively applied to a semiconductor device having a nonvolatile memory element.

2. Background Art

As the semiconductor device, for example, a nonvolatile semiconductor-memory-device called flash memory is known. In a memory cell of the flash memory, one-transistor system comprising one nonvolatile element, or two-transistor system comprising one nonvolatile memory element and one selection MISFET (Metal Insulator Semiconductor Field Effect Transistor), which are connected in series, are known. In the nonvolatile memory element; a floating gate type in which data are stored in a floating gate electrode between a semiconductor substrate and a control gate electrode; a MNOS (Metal Nitride Oxide Semiconductor) type in which an ON (Oxide/Nitride) film is used for a gate insulating film (data-storage insulating film) between the semiconductor substrate and the gate electrode, and data are stored in the gate insulating film; and a MONOS (Metal Oxide Nitride Oxide Semiconductor) type in which an ONO (Oxide/Nitride/Oxide) film is used for the gate insulating film (data-storage insulating film) between the semiconductor substrate and the gate electrode, and data are stored in the gate insulating film are known.

JP-A-2002-164449 discloses a nonvolatile memory element having a multi-storage configuration in which a memory-gate electrode is disposed on a main surface of the semiconductor substrate via the data-storage insulating film, and switching gate electrodes are disposed on both sides of the memory-gate electrode.

SUMMARY OF THE INVENTION

In the MONOS nonvolatile-memory-element, for example, since data erasing is performed by injecting hot holes from a semiconductor substrate side into a silicon nitride film of the charge-storage insulating film, the charge-storage insulating film deteriorates according to the number of rewriting. Accordingly, in the MONOS nonvolatile-memory-element, the number of rewriting is limited due to the deterioration of the charge-storage insulating film in erasing.

Thus, to improve the number of rewriting, the inventor investigated the deterioration of the change-storage insulating film, as a result the inventor found that the deterioration of the change-storage insulating film was able to be restrained by increasing a gate width Wg (channel width) to increase driving current (Ids). However, when the gate width is increased, since an area occupied by the nonvolatile memory element (cell size) is also increased, the degree of integration is reduced.

The MONOS nonvolatile-memory-element is used for storing program data for operating a logic operation circuit such as CPU or DSP. The MONOS nonvolatile-memory-element is also used for storing data (processed data) processed by executing the program. According to research on market demands by the inventor, it was found that, for example, in a microcomputer mounted with the nonvolatile memory and the logic operation circuit together, despite demands for a high-speed nonvolatile memory having a large capacity of 1M bytes or more, capacity of a memory that needs to be frequently rewritten was extremely small, about 32 K bites. Thus, the inventor focused on application of the MONOS nonvolatile-memory-element, consequently made the invention.

The invention intends to provide a technique by which the degree of integration and the number of rewriting of the semiconductor device having the nonvolatile memory element can be improved.

The above and other objects and novel features of the invention will be clarified according to description of the specification and accompanying drawings.

In the inventions disclosed in the application, summary of a typical one is briefly described as, follows.

The objects are achieved by mounting a first MONOS nonvolatile-memory-element and a second MONOS nonvolatile-memory-element having a large gate width compared with the first MONOS nonvolatile-memory-element together on the same substitute, wherein the first MONOS nonvolatile-memory-element is used for storing the program data which is scarcely rewritten, and the second MONOS nonvolatile-memory-element is used for storing the processed data (data that have been processed by executing the program) which is frequently rewritten.

In the inventions disclosed in the application, advantages obtained by the typical one are briefly described as follows.

According to the invention, the high degree of integration and the number of rewriting of the semiconductor device having the nonvolatile memory element can be improved.

DESCRIPTION OF THE PREFERRED EMBODIMENTS

Hereinafter, embodiments of the invention are described in detail with reference to drawings. In all drawings for describing the embodiments of the invention, elements having similar functionality are marked with same references, and repeated description of them is omitted.

First Embodiment

In the first embodiment, an example where the invention is applied to a microcomputer having a nonvolatile memory element in which elections injected into a silicon nitride film of the charge-storage insulating film are emitted to the gate electrode for data erasing is described.

Figure 1:
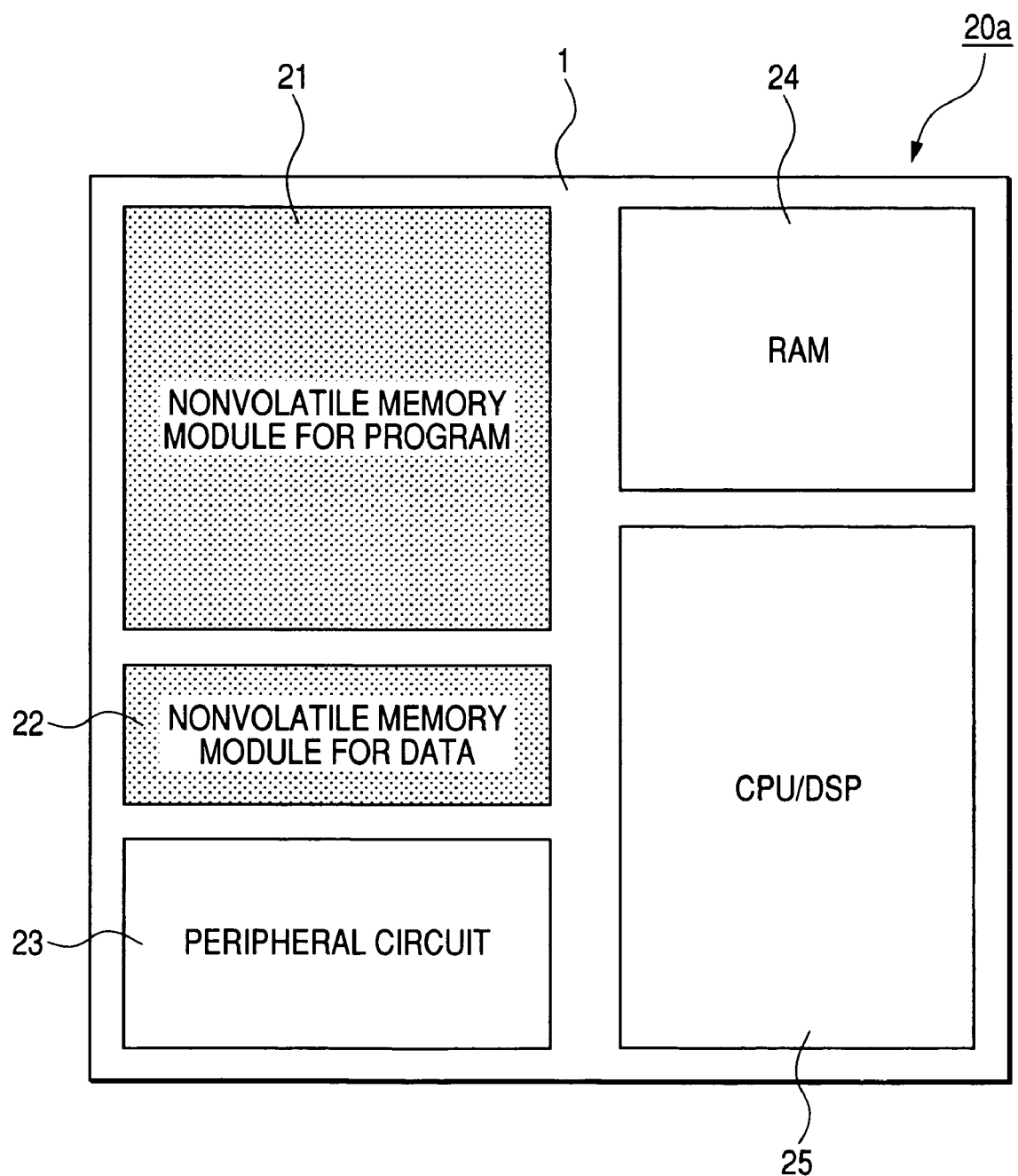
FIG. 1 is a plane layout chart of a microcomputer that is a first embodiment of the invention.
Figure 2:
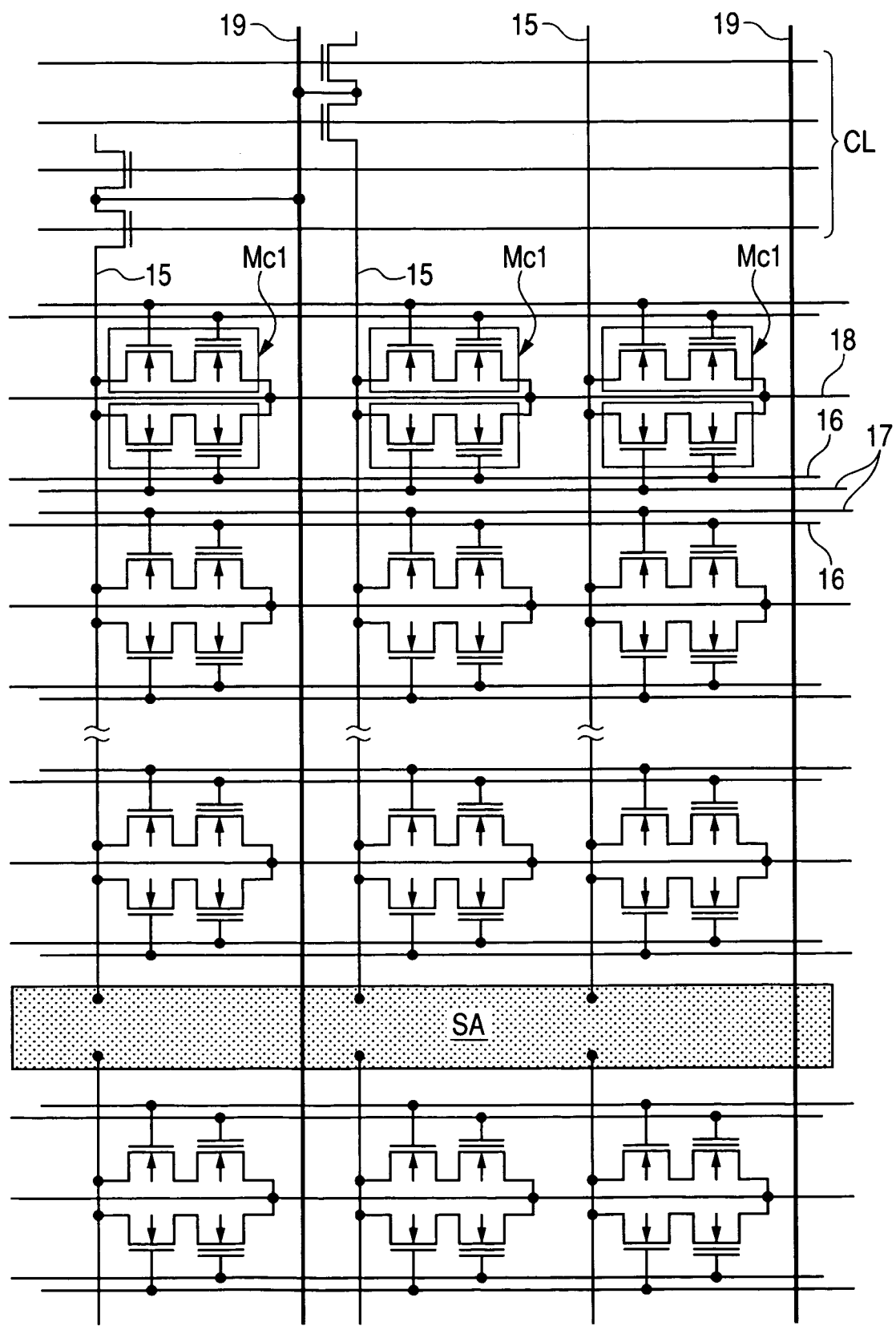
FIG. 2 is an equivalent circuit diagram showing a part of a program nonvolatile-memory-module mounted in the microcomputer of FIG. 1.
Figure 3:
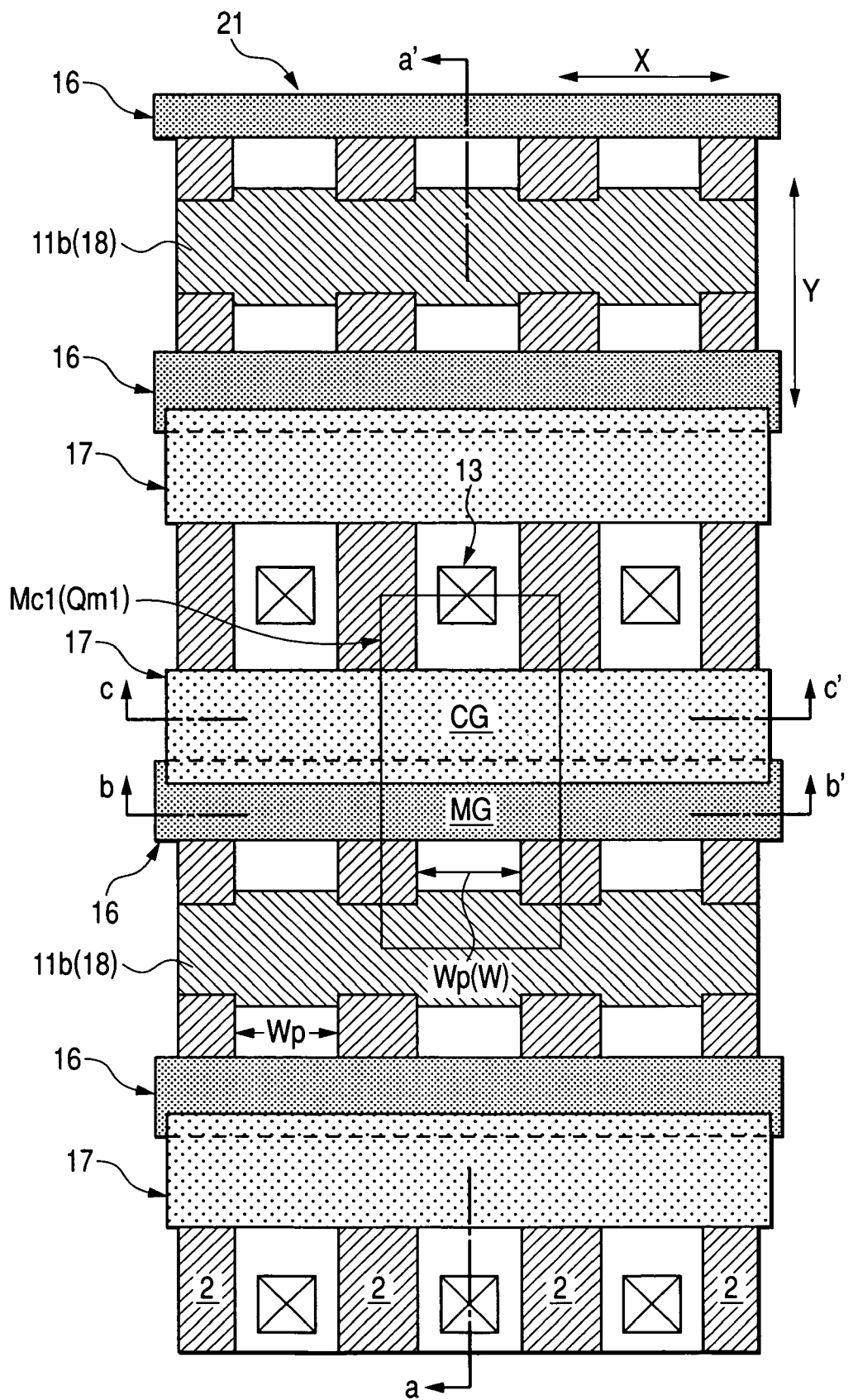
FIG. 3 is a schematic plan view showing the part of the program nonvolatile-memory-module mounted in the microcomputer of FIG. 1.
Figure 4:
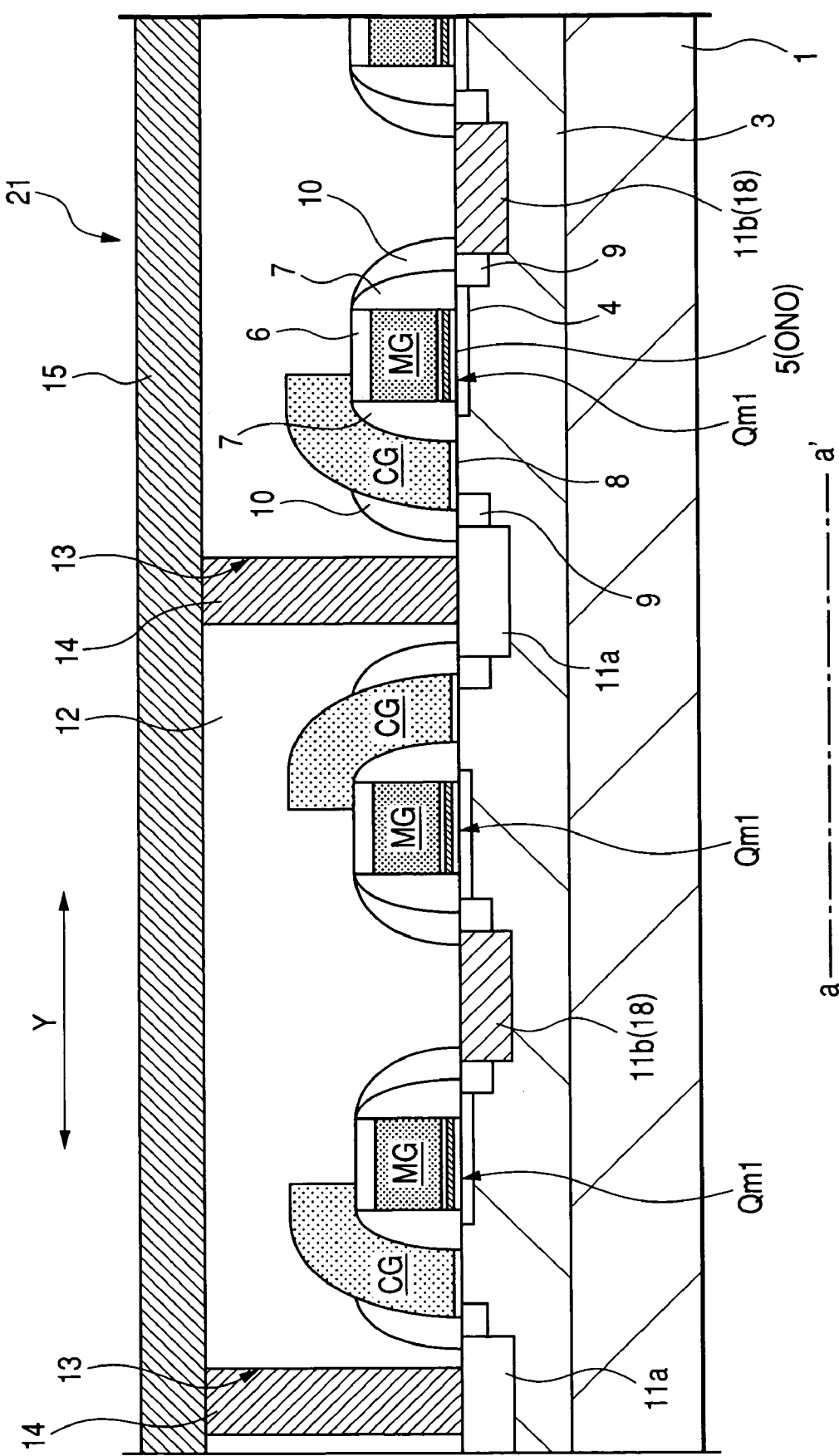
FIG. 4 is a schematic section view along a line a-a' of FIG. 3.
Figure 5:
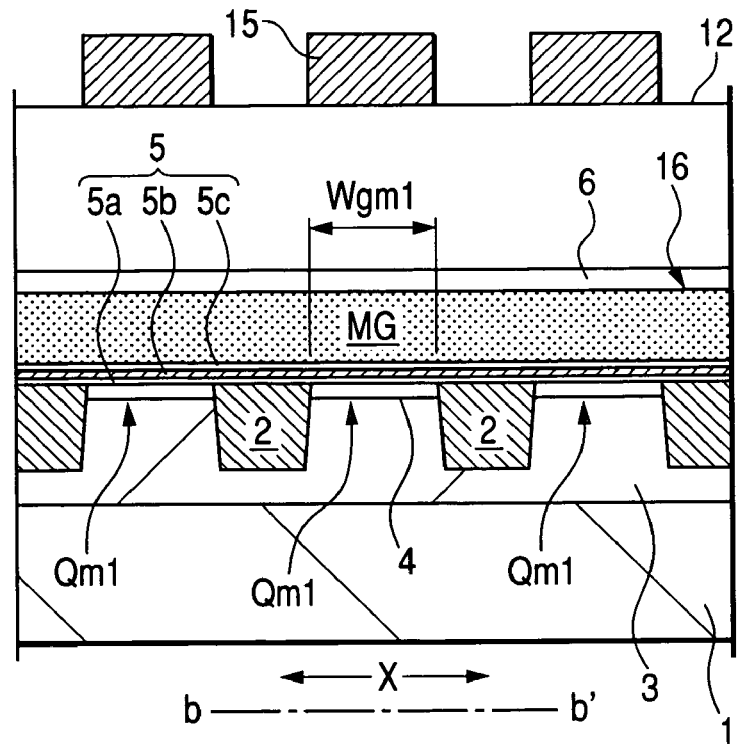
FIG. 5 is a schematic section view along a line b-b' of FIG. 3.
Figure 6:
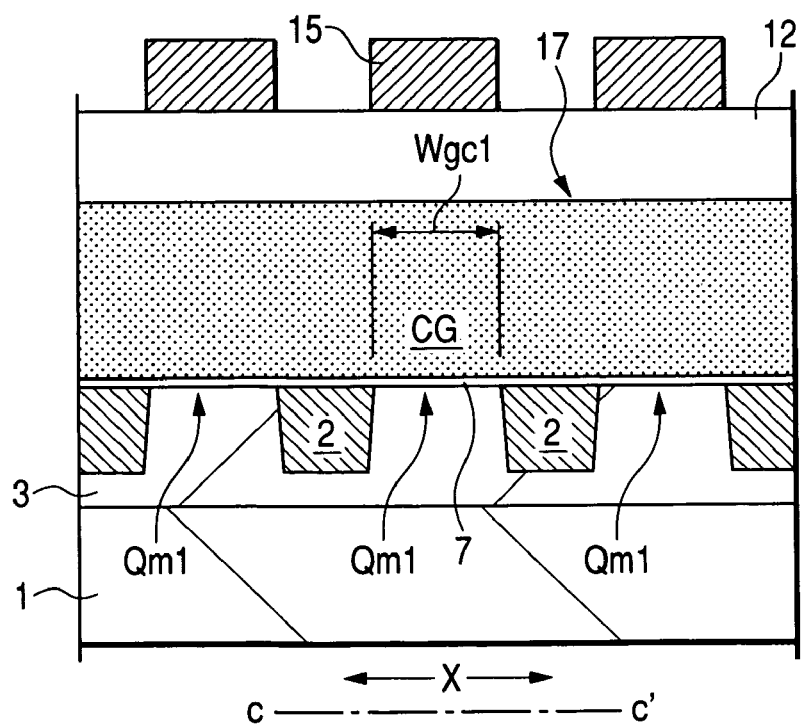
FIG. 6 is a schematic section view along a line c-c' of FIG. 3.
Figure 7:
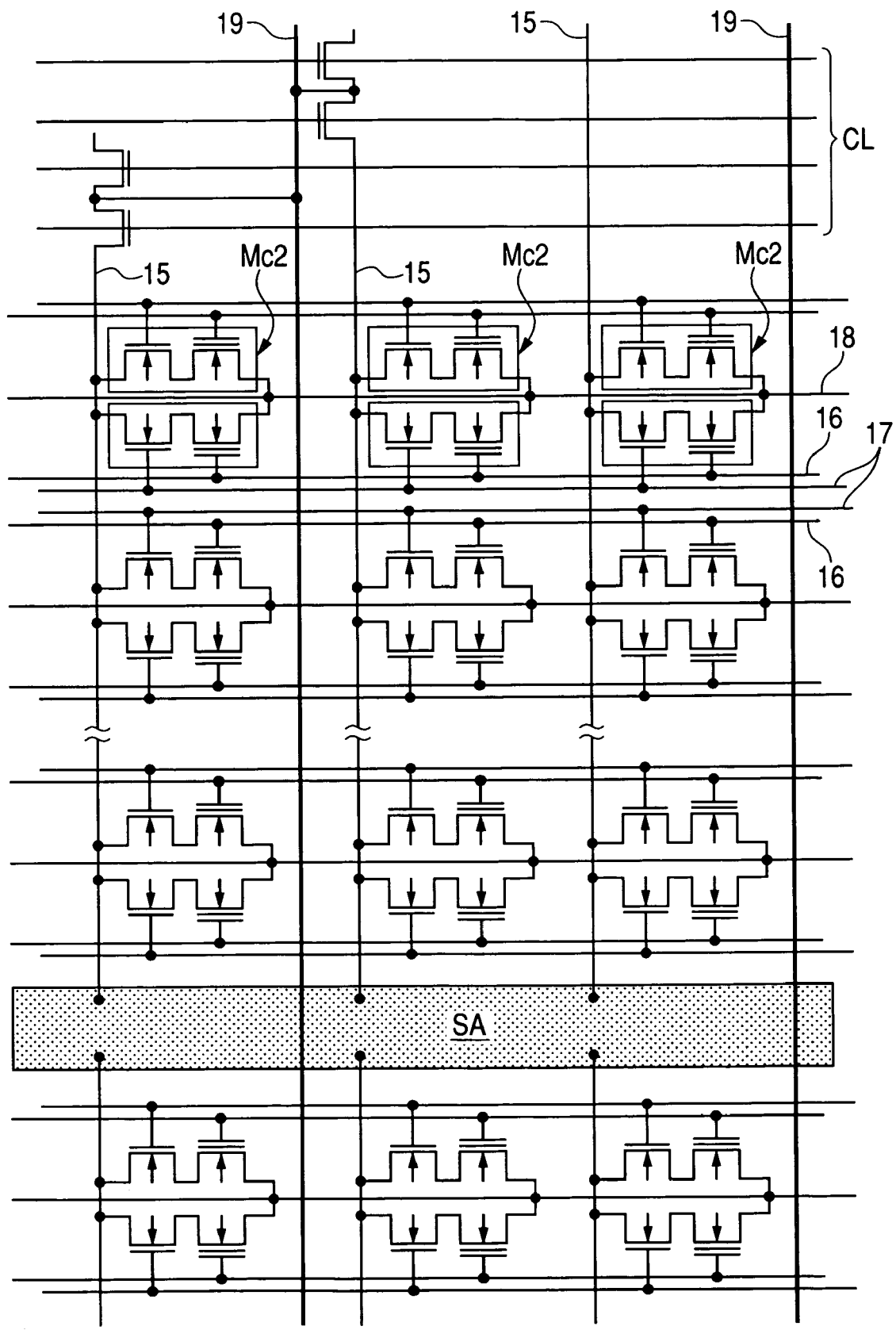
FIG. 7 is a schematic plan view showing a part of a data nonvolatile-memory-module mounted in the microcomputer of FIG. 1.
Figure 8:
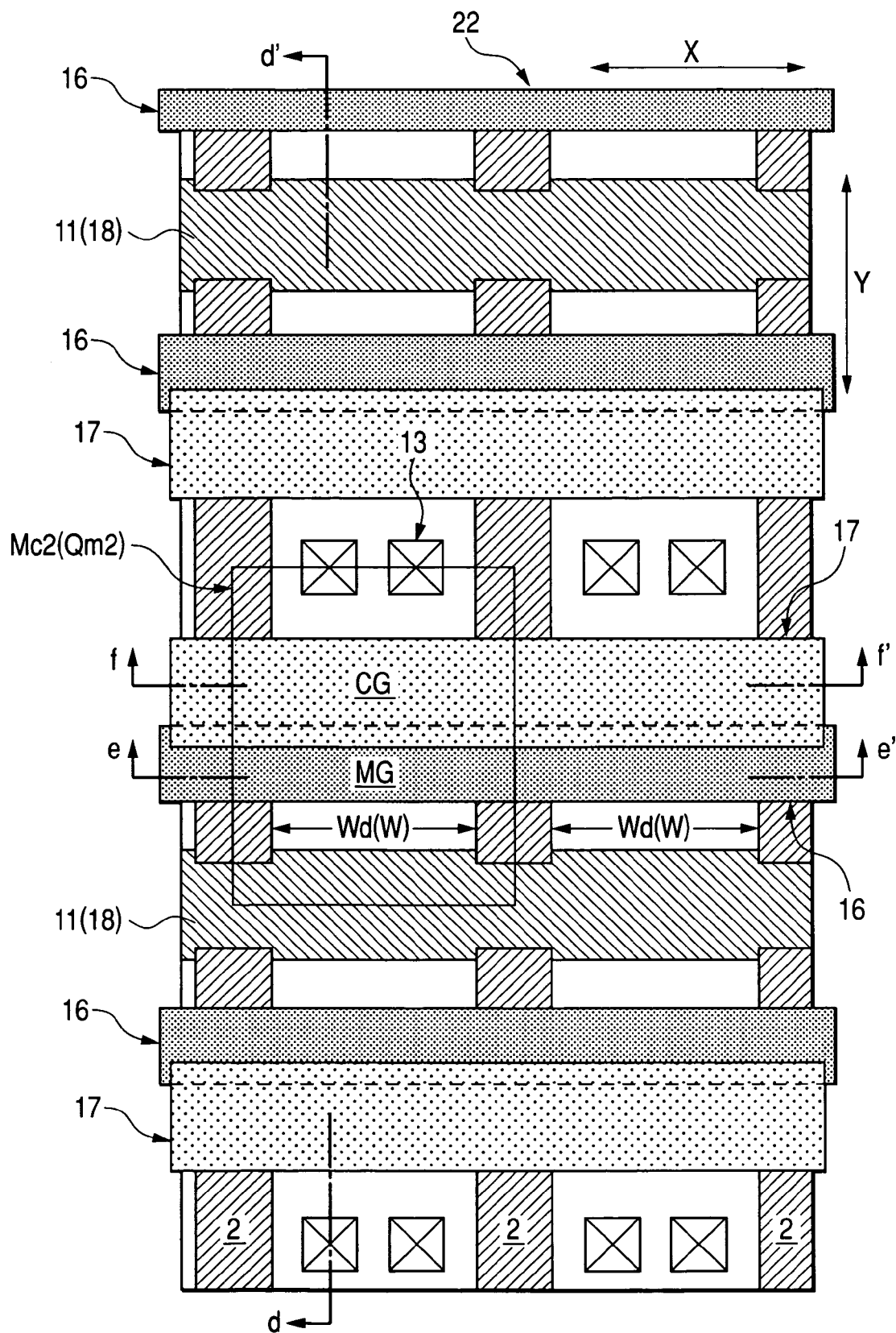
FIG. 8 is a schematic plan view showing the part of the data nonvolatile-memory-module mounted in the microcomputer of FIG. 1.
Figure 9:
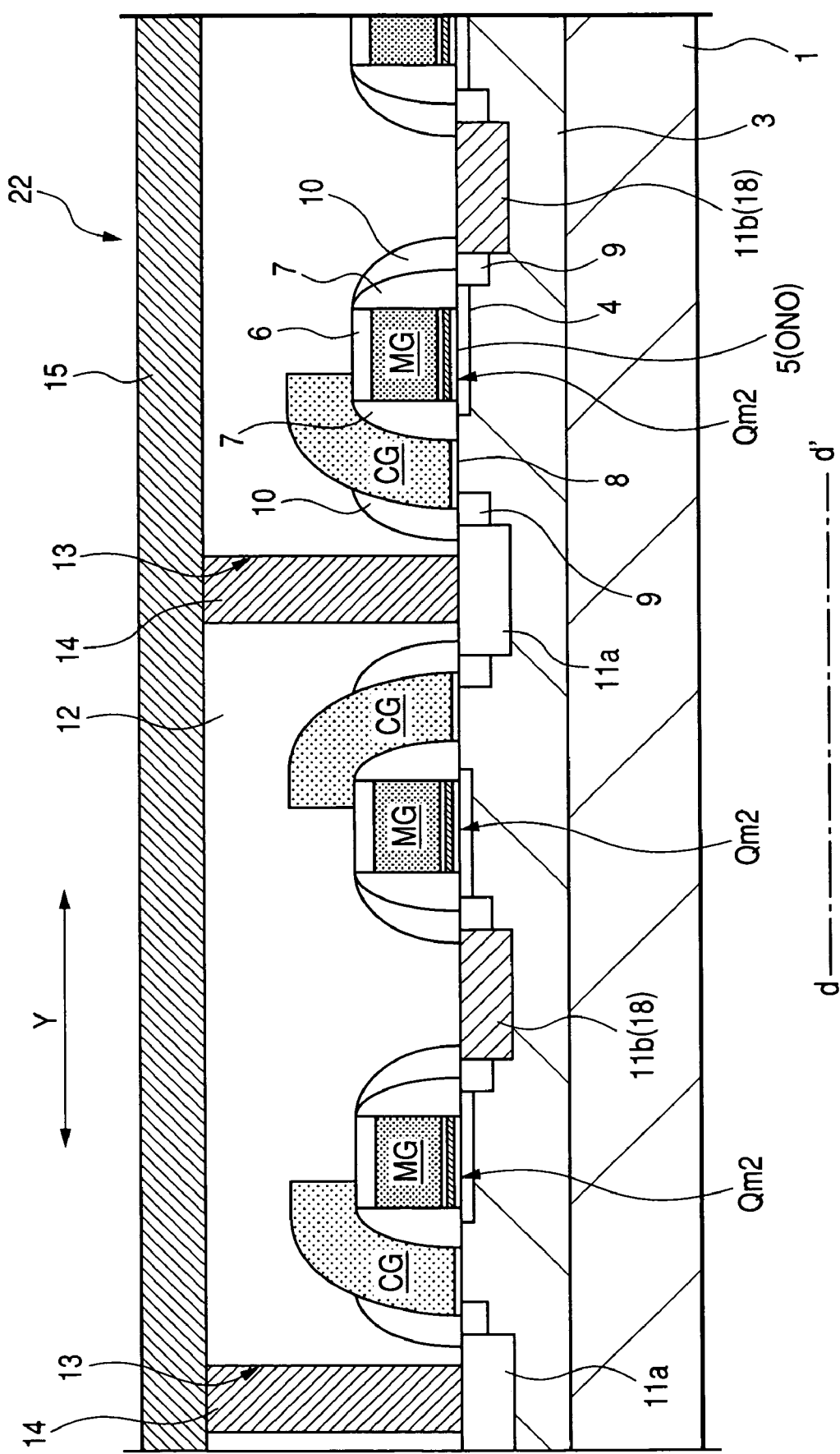
FIG. 9 is a schematic section view along a line d-d' of FIG. 8.
Figure 10:
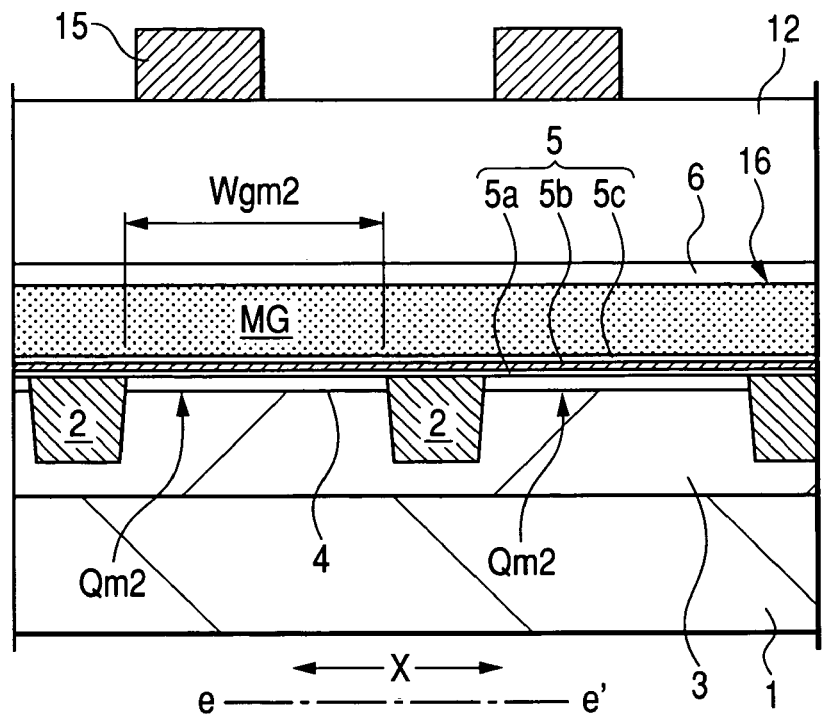
FIG. 10 is a schematic section view along a line e-e' of FIG. 8.
Figure 11:
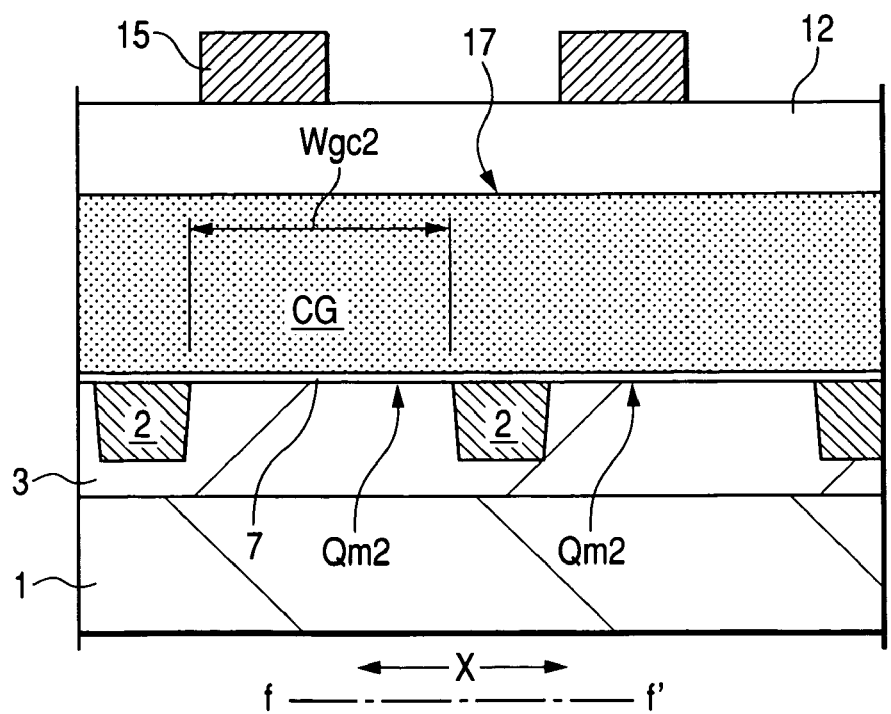
FIG. 11 is a schematic section view along a line f-f' of FIG. 8.

FIG. 1 to FIG. 12 are views according to a microcomputer (semiconductor device) of the first embodiment of the invention, wherein, FIG. 1 is a plane layout chart of the microcomputer;

FIG. 2 is an equivalent circuit diagram showing a part of a program nonvolatile-memory-module mounted in the microcomputer of FIG. 1;

FIG. 3 is a schematic plan view showing the part of the program nonvolatile-memory-module mounted in the microcomputer of FIG. 1;

FIG. 4 is a schematic section view along a line a-a' of FIG. 3;

FIG. 5 is a schematic section view along a line b-b' of FIG. 3;

FIG. 6 is a schematic section view along a line c-c' of FIG. 3;

FIG. 7 is a schematic plan view showing a part of a data nonvolatile-memory-module mounted in the microcomputer of FIG. 1;

FIG. 8 is a schematic plan view showing the part of the data nonvolatile-memory-module mounted in the microcomputer of FIG. 1;

FIG. 9 is a schematic section view along a line d-d' of FIG. 8;

FIG. 10 is a schematic section view along a line e-e' of FIG. 8;

FIG. 11 is a schematic section view along a line f-f' of FIG. 8; and

Figure 12:
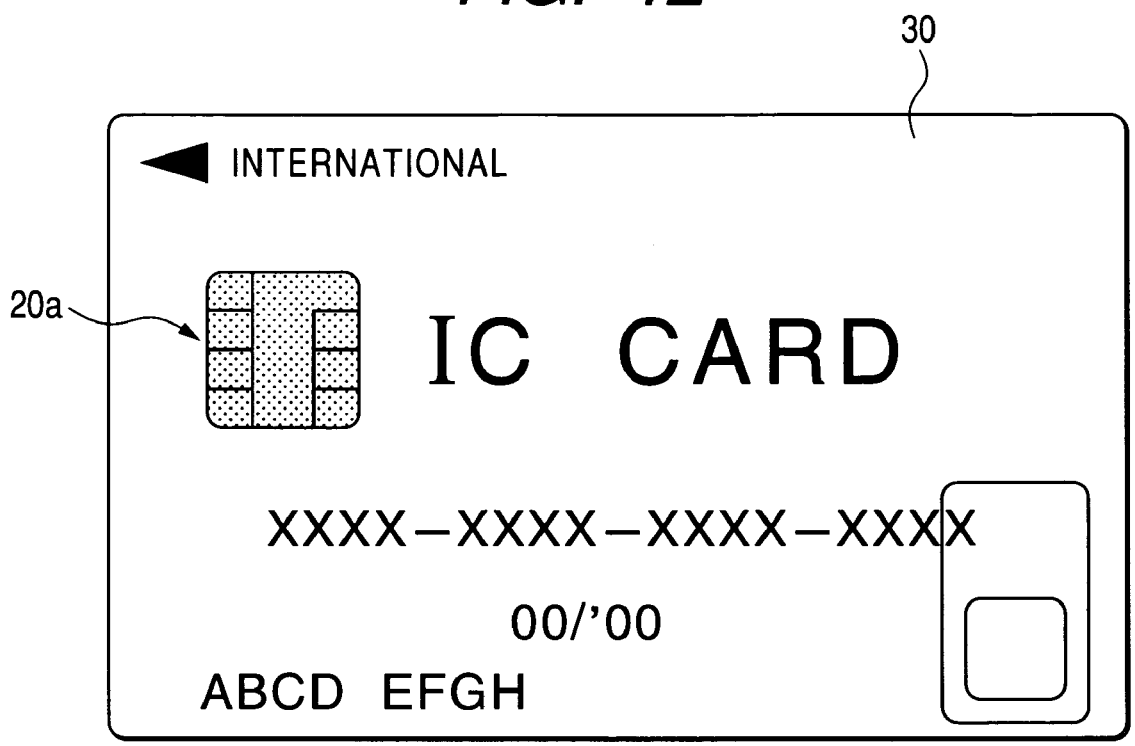
FIG. 12 is a schematic section view showing an IC card mounted with the microcomputer of FIG. 1.

FIG. 12 is a schematic section view showing an IC card mounted with the microcomputer of FIG. 1.

As shown in FIG. 1, a microcomputer 20a of the first embodiment mainly comprises a p-type semiconductor substitute 1 comprising, for example, single-crystal silicon (hereinafter, simply referred to as silicon substitute). The silicon substrate 1 has a square shape in a plane perpendicular to a thickness direction, for example, a rectangle about 5.14 mm wide and 5.24 mm long in the first embodiment.

On a main surface (surface for forming a circuit, or surface for forming an element) of the silicon substrate 1, a program nonvolatile-memory-module (unit) 21, a data nonvolatile-memory-module 22, a peripheral circuit module 23, a RAM (Random Access Memory) module 24, and a logic operation circuit module 25 are mounted. Each of the modules is partitioned by an interconnection channel region.

In the RAM module 24, a circuit of memory such as DRAM (Dynamic Random Access Memory) or SRAM (Static Random Access Memory) is formed. In the logic operation circuit module 25, a logic operation circuit such as CPU (Central Processing Unit) or DSP (Digital Signal Processor) is formed.

In the program nonvolatile-memory-module 21, as shown in FIG. 2, multiple memory cells Mc1 are disposed in a matrix pattern (array pattern). One memory cell Mc1 comprises one nonvolatile memory element Qm1 as shown in FIG. 4. In the data nonvolatile-memory-module 22, as shown in FIG. 7, multiple memory cells Mc2 are disposed in the matrix pattern (array pattern). One memory cell Mc2 comprises one nonvolatile memory element Qm2 as shown in FIG. 9.

As shown in FIG. 2 and FIG. 3, in the program nonvolatile-memory-module 21, multiple gate interconnections 16 extending along an X direction, multiple gate interconnections 17, multiple source interconnections 18, and multiple bit-line selection lines CL are disposed, furthermore, multiple sub-bit-lines 15 and multiple main-bit-lines 19 extending along a Y direction are disposed. Each of the sub bit lines 15 is electrically connected to a sense amplifier SA provided in correspondence with each of the sub bit lines 15.

As shown in FIG. 7 and FIG. 8, in the data nonvolatile-memory-module 22, as the program nonvolatile-memory-module 21, the multiple gate interconnections 16 extending along the X direction, multiple gate interconnections 17, multiple source interconnections 18, and multiple bit-line selection lines CL are disposed, furthermore, the multiple sub-bit-lines 15 and the multiple main-bit-lines 19 extending along the Y direction are disposed. Each of the sub bit lines 15 is electrically connected to the sense amplifier SA provided in correspondence with each of the sub bit lines 15. Although a configuration of the memory array is similar to the program nonvolatile-memory-module, the array for data is designed such that length of the memory cell in a gate-width direction (channel-width direction) is large compared with the array for program. Specifically, the array are formed such that a relation of Wd>Wp is made between a gate width (channel width) Wp of the nonvolatile memory element Qm1 of the program nonvolatile-memory-module 21 and a gate width (channel width) Wd of the nonvolatile memory element Qm2 of the data nonvolatile-memory-module 22.

As shown in FIG. 3, FIG. 5 and FIG. 6, FIG. 8, and FIG. 10 and FIG. 11, on the main surface of the silicon substitute 1, element isolation regions 2 for partitioning active regions used for regions for forming transistor elements are selectively formed. The element isolation region 2 is formed using, for example, a known STI (Shallow Trench Isolation) technique, however, it is not limited to this. The element isolation region 2 using the STI technique is formed by forming a shallow trench (for example, trench about 300 nm deep) on the main surface of the silicon substrate 1, then forming an insulating film comprising, for example, a silicon oxide film on the main surface of the silicon substrate 1 using a CVD (Chemical Vapor Deposition) method, and then performing planarization using a CMP (chemical Mechanical Polishing) method such that the insulating film is selectively remained within the shallow trench. As another method for forming the element isolation region 2, a LOCOS (Local Oxidation of Silicon) method using a thermal oxidation method can be used.

In the program nonvolatile-memory-module 21, as shown in FIG. 4, a p-type well region 3 is formed in the active region of the main surface of the silicon substitute 1, and the nonvolatile memory element Qm1 forming the memory cell Mc1 is formed in the p-type well region 3. As shown in FIG. 4 to FIG. 6, the nonvolatile memory element Qm1 is configured to have a channel formation region, a charge-storage insulating film 5 that acts as a charge storage section, a memory-gate electrode MG, a gate insulating film 8, a control-gate electrode CG, and source and drain regions, and it has a configuration where control MISFET (pass transistor) and MONOS FET are connected in series in an equivalent circuit.

The memory-gate electrode MG is provided in the active region of the main surface of the silicon substrate 1 via the gate insulating film 5 that acts as the data storage section. The memory-gate electrode MG is formed from, for example, a polycrystalline silicon film doped with impurities for reducing a resistance value. On an upper surface of the memory-gate electrode MG, an insulating film (cap insulating film) 6 comprising, for example, the silicon oxide film is provided in a way that it covers the upper surface.

The charge-storage insulating film 5 is formed from an ONO (oxide/Nitride/Oxide) film, and in the embodiment the film 5 is formed from, for example, an ONO film of silicon oxide film (SiO) 5a/silicon nitride film (SiN) 5b/silicon oxynitride film (SiON) 5c disposed in this order from a side of the main surface of the silicon substrate 1.

In a gate length direction of the memory-gate electrode MG, sidewall spacers 7 formed in alignment with the memory-gate electrode MG are provided on two sidewalls located at opposite sides of the memory-gate electrode MG, respectively. The sidewall spacers 7 are formed from, for example, an insulating film comprising the silicon oxide film.

The control-gate electrode CG is provided in the active region of the main surface of the silicon substrate 1 via the gate insulating film 8. The control-gate electrode CG is provided next to the memory-gate electrode MG with its gate length being along a gate length direction of the memory-gate electrode MG. In the embodiment, the control-gate electrode CG has a configuration where it partially reposes on the memory-gate electrode MG, and is electrically isolated from the memory-gate electrode MG by the insulating film 6 and one of the sidewall spacers 7. The control-gate electrode CG is formed from, for example, a polycrystalline silicon film doped with the impurities for reducing the resistance value, and the gate insulating film 8 is formed from, for example, the silicon oxide film.

In the two sidewall spacers 7, outside the other sidewall spacer 7 (at a side opposite to a side of the control-gate electrode CG), a sidewall spacer 10 formed in alignment with the other sidewall spacer 7 is provided. In addition, outside the control-gate electrode CG, a sidewall spacer 10 formed in alignment with the control-gate electrode CG is provided. The sidewall spacers 10 are formed from, for example, an insulating film comprising the silicon oxide film.

The source and the drain regions are configured to have a pair of n-type semiconductor regions (extension region) 9 and a pair of n-type semiconductor regions (contact region) 11a, 11b. In the pair of n-type semiconductor regions 9, one of the n-type semiconductor regions 9 is provided on the main surface of the silicon substrate 1 in alignment with the other sidewall spacer 7 (at the side opposite to the side of the control-gate electrode CG), and the other of the n-type semiconductor regions 9 is provided on the main surface of the silicon substrate 1 in alignment with the sidewall spacer 10 provided outside the control-gate electrode CG. In the pair of n-type semiconductor regions 11a, 11b, one of the n-type semiconductor regions 11b is provided on the main surface of the silicon substrate 1 in alignment with the other sidewall spacer 10 (at a side of the memory-gate electrode MG), and the other of the n-type semiconductor regions 11a is provided on the main surface of the silicon substrate 1 in alignment with the sidewall spacer 10 at the side of the control-gate electrode CG.

The channel formation region is provided immediately under the control-gate electrode CG and the memory-gate electrode MG, in other words, provided on a surface of the silicon substrate 1 between the source and drain regions. In the channel formation region, a p-type semiconductor region 4 is provided. The p-type semiconductor region 4 is provided in opposition to the memory-gate electrode MG, and forms a p-n junction with one of the n-type semiconductor regions 9 (at the MG side).

In the nonvolatile memory elements Qm1 adjacent to each together in the Y direction, the drain region (n-type semiconductor region 11a) and the source region (n-type semiconductor region 11b) are combined. As shown in FIG. 3, the n-type semiconductor region 11b extends along the X direction and is used as the source interconnection 18 shown in FIG. 2. That is, the source interconnection 18 extending along the X direction is formed from the n-type semiconductor region 11b.

As shown in FIG. 3 and FIG. 5, in the nonvolatile memory elements Qm1 adjacent to each together in the X direction, respective memory-gate electrodes MG are formed from a part of the gate interconnections 16 extending along the X direction, in other words, formed integrally with the gate interconnections 16. In addition, as shown in FIG. 3 and FIG. 6, in the nonvolatile memory elements Qm1 adjacent to each together in the X direction, respective control-gate electrodes CG are formed from a part of the gate interconnections extending along the X direction, in other words, formed integrally with the gate interconnections 17. The gate interconnections 16 and 17 are formed from, for example, the polycrystalline silicon film doped with the impurities for reducing the resistance value.

As shown in FIG. 4 and FIG. 6, the nonvolatile memory elements Qm1 disposed in the program nonvolatile-memory-module 21 are covered with an interlayer insulating film 12 provided on the main surface of the silicon substrate 1, and the multiple sub-bit-lines 15 extending along the Y direction are disposed on the interlayer insulating films 12. The sub bit lines 15 are formed from a conductive metal film such as Al film, Al alloy film, Cu film, or Cu alloy film. The interlayer insulating film 12 is formed from, for example, the silicon oxide film.

On the drain regions (n-type semiconductor regions 11a) of the nonvolatile memory elements Qm1 adjacent to each together in the Y direction, connection holes 13 running from a surface of the interlayer insulating film 12 to the n-type semiconductor regions 11a are provided, and conductive plugs 14 are filled in the connection holes 13. The drain regions (n-type semiconductor regions 11a) of the nonvolatile memory elements Qm1 adjacent to each together in the Y direction are electrically connected to the sub bit lines 15 extending over the interlayer insulating film 12 via the conductive plugs 14.

The data nonvolatile-memory-module 22 has a configuration essentially similar to the program nonvolatile-memory-module 21, as shown in FIG. 7 and FIG. 8. In addition, the nonvolatile memory element Qm2 disposed in the data nonvolatile-memory-module 22 has a configuration essentially similar to the nonvolatile memory element Qm1, as shown in FIG. 9 to FIG. 11. However, the gate width (channel width) Wd of the nonvolatile memory element Qm2 is larger than the gate width (channel width) Wp of the nonvolatile memory element Qm1 though it is described in detail later.

As shown in FIG. 2 and FIG. 7, the nonvolatile memory elements Qm1 and Qm2 have a configuration where the MONOS FET and the control MISFET (pass transistor) are connected in series in the equivalent circuit, wherein when hot electrons are injected into a trap in the silicon nitride film 5b in the charge-storage insulating film 5 under the memory-gate electrode MG, threshold voltage of the MONOS FET (threshold voltage Vth at a point under the memory-gate electrode MG) is changed, and threshold voltage of an entire system including the control MISFET and the MONOS FET which are connected in series (threshold voltage of the entire system including threshold voltage at the control-gate electrode CG and the threshold voltage at the memory-gate electrode MG) is changed. That is, the nonvolatile memory elements Qm1 and Qm2 have a configuration where charges are stored in the charge-storage insulating film 5, thereby threshold voltage of drain current flowing between the source and the drain is controlled for memory operation.

In the charge-storage insulating film 5, the film into which the hot electrons are injected is not particularly limited to the silicon nitride (SiN) film, and can be formed from an insulating film containing nitrogen in the film such as silicon oxynitride (SiON) film. When such a silicon oxynitride film is used to form the insulating film, withstanding voltage of the charge-storage insulating film 5 can be improved compared with the case that the silicon nitride film is used. Therefore, resistance to degradation of carrier mobility at a substrate surface (neighborhood of an interface between the substrate and the charge-storage insulating film) under the memory-gate electrode MG according to the number of injection of the hot electrons or the hot holes, which is described later, can be improved.

Writing to the nonvolatile memory elements Qm1 and Qm2 is performed by applying, for example, a voltage of 1 V to the n-type semiconductor region 11a of the drain region, 6 V to the n-type semiconductor region 11b of the source region, 12 V to the memory-gate electrode MG, 1.5 V to the control-gate electrode CG, and 0 V to the p-type well region 3, and thus injecting the hot electrons from a side of the channel formation region (substrate 1 side) under the memory-gate electrode MG into the silicon nitride film 5b of the charge-storage insulating film 5. The injection of the hot electrons is performed by allowing the electron to pass through the silicon oxide film 5a as a bottom layer of the charge-storage insulating film 5.

Erasing of the nonvolatile memory elements Qm1 and Qm2 is performed by applying, for example, a voltage of 0 V to the source and drain regions, 14V to the memory-gate electrode MG, and 0 V to the control-gate electrode CG and the p-type well region 3, and thus allowing tunneling of electrons through the silicon oxynitride film 5c as a top layer of the charge-storage insulating film 5 and emitting the electrons from the silicon nitride film 5b of the charge-storage insulating film 5 to the memory-gate electrode MG.

Reading from the nonvolatile memory elements Qm1 and Qm2 is performed by applying, for example, an electric potential of 0 V to the source region, 1.5 V to the drain region, 1.5 V to the memory-gate electrode MG and the control-gate electrode CG, and 0 V to the p-type well region 3, respectively.

A gate width Wgm2 of the nonvolatile memory element Qm2 under the memory-gate electrode MG (see FIG. 1) is larger than a gate width Wgm1 of the nonvolatile memory element Qm1 under the memory-gate electrode MG (see FIG. 5); and a gate width Wgc2 of the nonvolatile memory element Qm2 under the control-gate electrode CG (see FIG. 11) is larger than a gate width Wgc1 of the nonvolatile memory element Qm1 under the control-gate electrode CG see FIG. 6). That is, the gate width (channel width) Wd of the nonvolatile memory element Qm2 is larger than the gate width (channel width) Wp of the nonvolatile memory element Qm1. In the first embodiment, the gate width of the nonvolatile memory element Qm2 is, for example, about three times the gate width of the nonvolatile memory element Qm1.

In the program nonvolatile-memory-module 21 and the data nonvolatile-memory-module 22, as shown in FIG. 5 and FIG. 6, and FIG. 10 and FIG. 11, the gate interconnections 16 and 17 extend over the active regions and the element isolation regions 2. Therefore, in the nonvolatile memory elements Qm1 and Qm2, the gate widths Wgm1, Wgm2 under the memory-gate electrode MG and the gate widths Wgc1, Wgc2 under the control-gate electrode CG are defined by the element isolation regions 2. The gate length under the memory-gate electrode MG and the gate length under the control-gate electrode CG are defined by length between the source and drain regions. In the first embodiment, the gate lengths of the nonvolatile memory elements Qm1 and Qm2 are, for example, about 0.5 µm, the gate width of the nonvolatile memory element Qm 1 is, for example, about 0.32 µm, and the gate width of the nonvolatile memory element Qm2 is, for example, about 1.0 µm.

The nonvolatile memory element Qm1 disposed in the program nonvolatile-memory-module 21 is used for storing the program data for operating the logic operation circuit such as CPU or DSP disposed in the logic operation circuit module 25. The nonvolatile memory element Qm2 disposed in the data nonvolatile-memory-module 22 is used for storing the processed data which have been processed by executing the program. That is, the microcomputer 20a of the first embodiment has the MONOS nonvolatile-memory-element Qm1 and the MONOS nonvolatile-memory-element Qm2 having a large gate width compared with the MONOS nonvolatile-memory-element Qm1 mounted together on the same substrate, wherein the MONOS nonvolatile-memory-element Qm1 is used for storing the program data which is scarcely rewritten, and the MONOS nonvolatile-memory-element Qm2 is used for storing the processed data which is frequently rewritten.

The microcomputer 20a configured in this way is mounted in a noncontact IC card 30 as shown in FIG. 12.

Here, the number of rewriting of the MONOS nonvolatile-memory-element is described.

Figure 13:
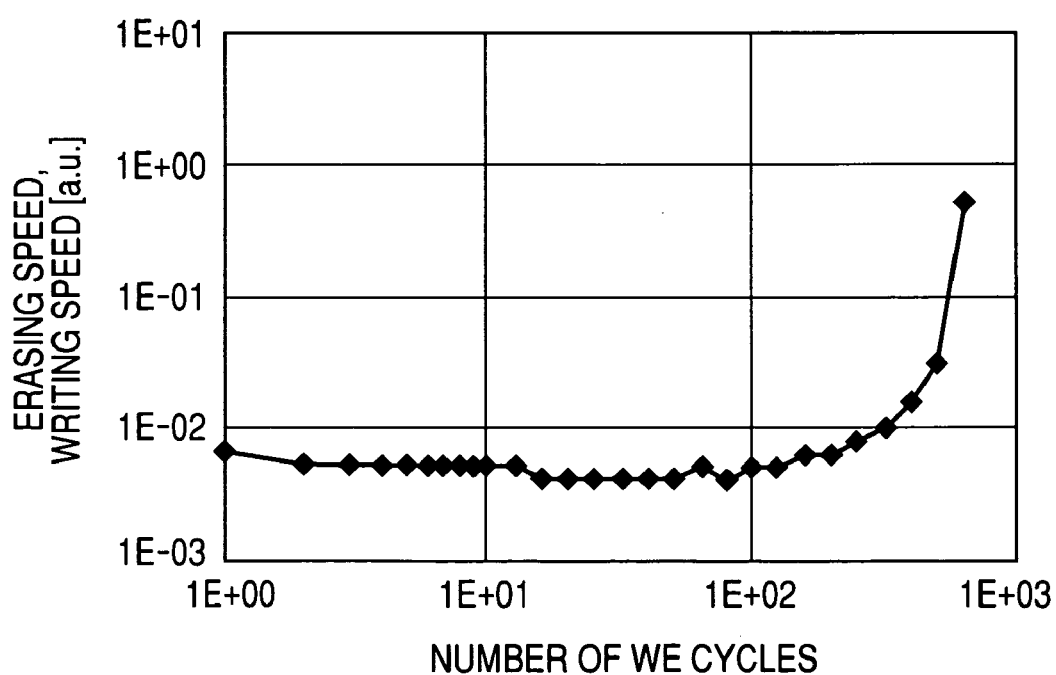
FIG. 13 is a diagram showing a relation between the number of rewriting and rewriting time of a nonvolatile memory element.
Figure 14:
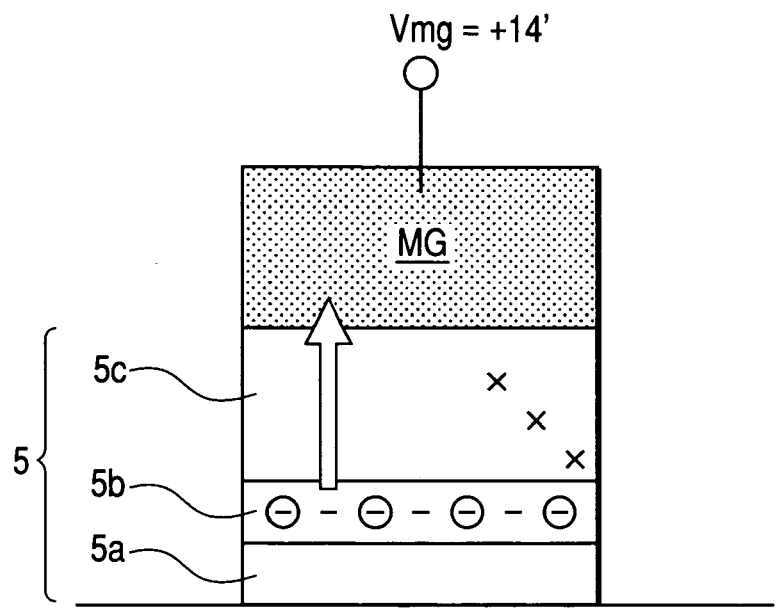
FIG. 14 is a view showing a deterioration model of a charge-storage insulating film due to erasing of a nonvolatile memory element.

FIG. 13 is a view showing a relation between the number of rewriting and the rewriting time, and FIG. 14 is a view showing a deterioration model of the charge-storage insulating film due to erasing.

In the nonvolatile memory element Qm1 of the first embodiment, data writing is performed by injecting hot electrons from the side of the channel formation region (substrate 1 side) under the memory-gate electrode MG into the silicon nitride film 5b of the charge-storage insulating film 5, and data rewriting is performed by allowing tunneling of electrons through the silicon oxynitride film 5c as the top layer of the charge-storage insulating film 5 and emitting the electrons from the silicon nitride film 5b of the charge-storage insulating film 5 to the memory-gate electrode MG. In such a nonvolatile memory element Qm1, as shown in FIG. 13, the rewriting time increases in orders of magnitude at about 1000 times, therefore rewriting operation as a product becomes impossible. This is considered to be due to the deterioration of the charge-storage insulating film in erasing. Since data erasing is performed using FN entire extraction by applying positive-bias voltage to the memory-gate electrode MG in the nonvolatile memory element Qm1, the deterioration is considered to be mainly deterioration of the silicon oxynitride film 5c as shown in FIG. 14.

Figure 15:
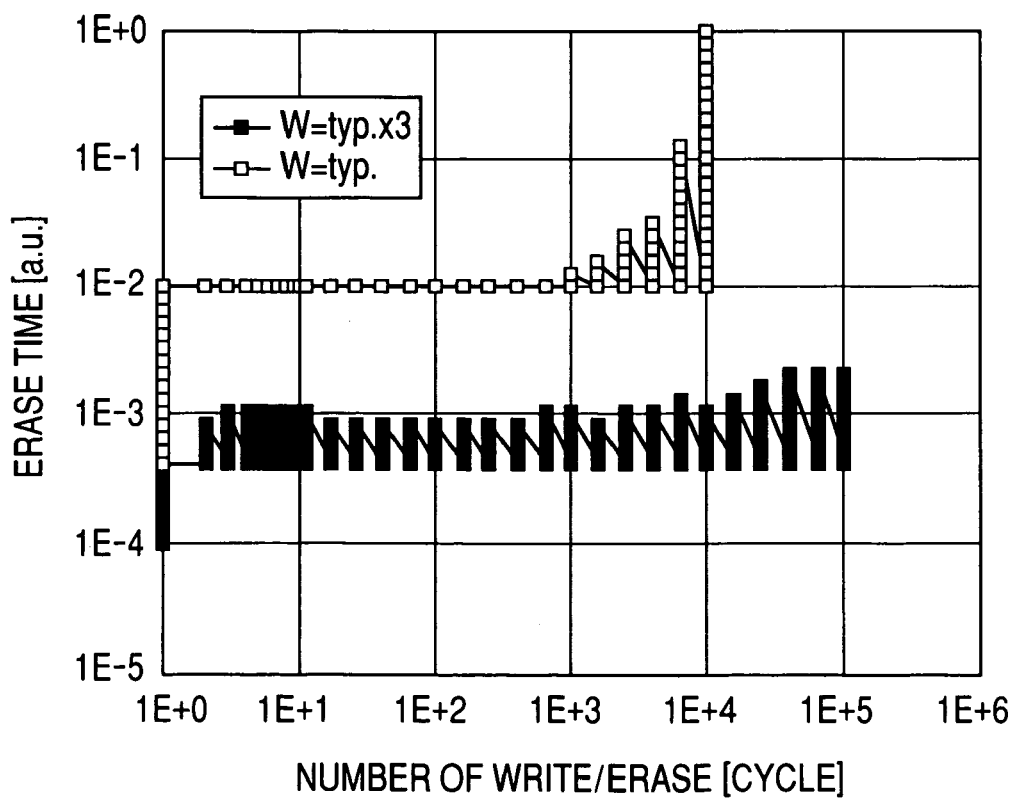
FIG. 15 is a diagram showing dependence on the number of rewriting of erasing time when a gate width W (width of a memory cell) is changed in the nonvolatile memory element.
Figure 16:
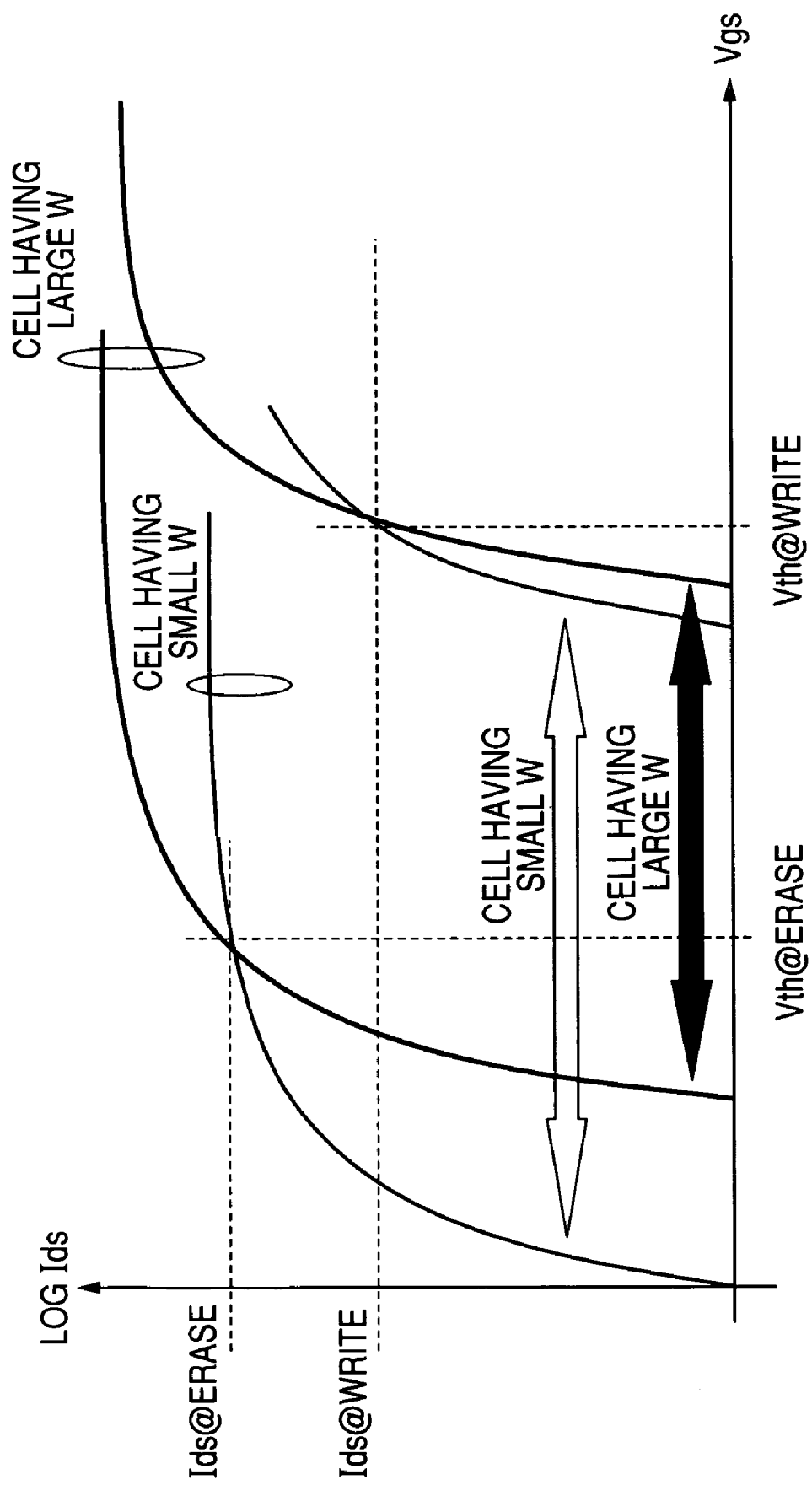
FIG. 16 is a diagram showing a relation between threshold voltage (Vth@Erase) and driving current (Ids@Erase) when the gate width W (width of the memory cell) is changed in the nonvolatile memory element.

FIG. 15 is a view showing dependence on the number of rewriting of erasing time when the gate width W (width of the memory cell) of the nonvolatile memory element is varied, and FIG. 16 is a view showing a relation between threshold voltage (Vth@Erase) and driving current (Ids@Erase) when the gate width W (width of the memory cell) of the nonvolatile memory element is varied. Although the gate width W is varied, an erasing state is defined as a point at which a fixed current flows. In the case of the example, as shown in FIG. 15, the gate width W (width of the memory cell) of the nonvolatile memory element is increased about three times, thereby the number of rewriting increased in two orders or more of magnitude can be effectively ensured. This is because the erasing state is defined as a point where the fixed current flows. As shown in FIG. 16, the erasing state is determined according to whether a defined driving-current Ids (Ids@Erase) flows at a fixed voltage (Vth@Erase) or not. In the case that the gate width W (width of the memory cell) of the nonvolatile memory element is large, since driving power is large, variation of Vth can be effectively reduced, and thus erasing stress which causes the deterioration can be reduced. Therefore, since resistance to rewriting can be improved with the deterioration being restrained, the number of rewriting can be improved.

However, since the nonvolatile memory element (memory cell) increases about three times in size in the example, the degree of integration is reduced. Thus, as the first embodiment, the nonvolatile memory element Qm1 having the small gate width W is used for storing the program data which is scarcely rewritten, and the nonvolatile memory element Qm2 having the large gate width W is used for storing the processed data which is frequently rewritten, thereby the reduction in the degree of integration due to increasing the gate width W of the nonvolatile memory element can be restrained, or the degree of integration can be improved compared with the case that the nonvolatile memory element Qm2 having the large gate width W is used for storing the program data which is scarcely rewritten, and for storing the processed data which is frequently rewritten.

In this way, according to the first embodiment, the number of rewriting and the degree of integration of the microcomputer 20a can be improved.

Second Embodiment

While an example, where the nonvolatile memory element used for storing the program data was separated from the nonvolatile memory element used for storing the processed data to form two nonvolatile memory modules, was described in the first embodiment; an example, where the nonvolatile memory element used for storing the program data and the nonvolatile memory element used for storing the processed data are mounted together to form one nonvolatile memory module, is described in the second embodiment.

Figure 17:
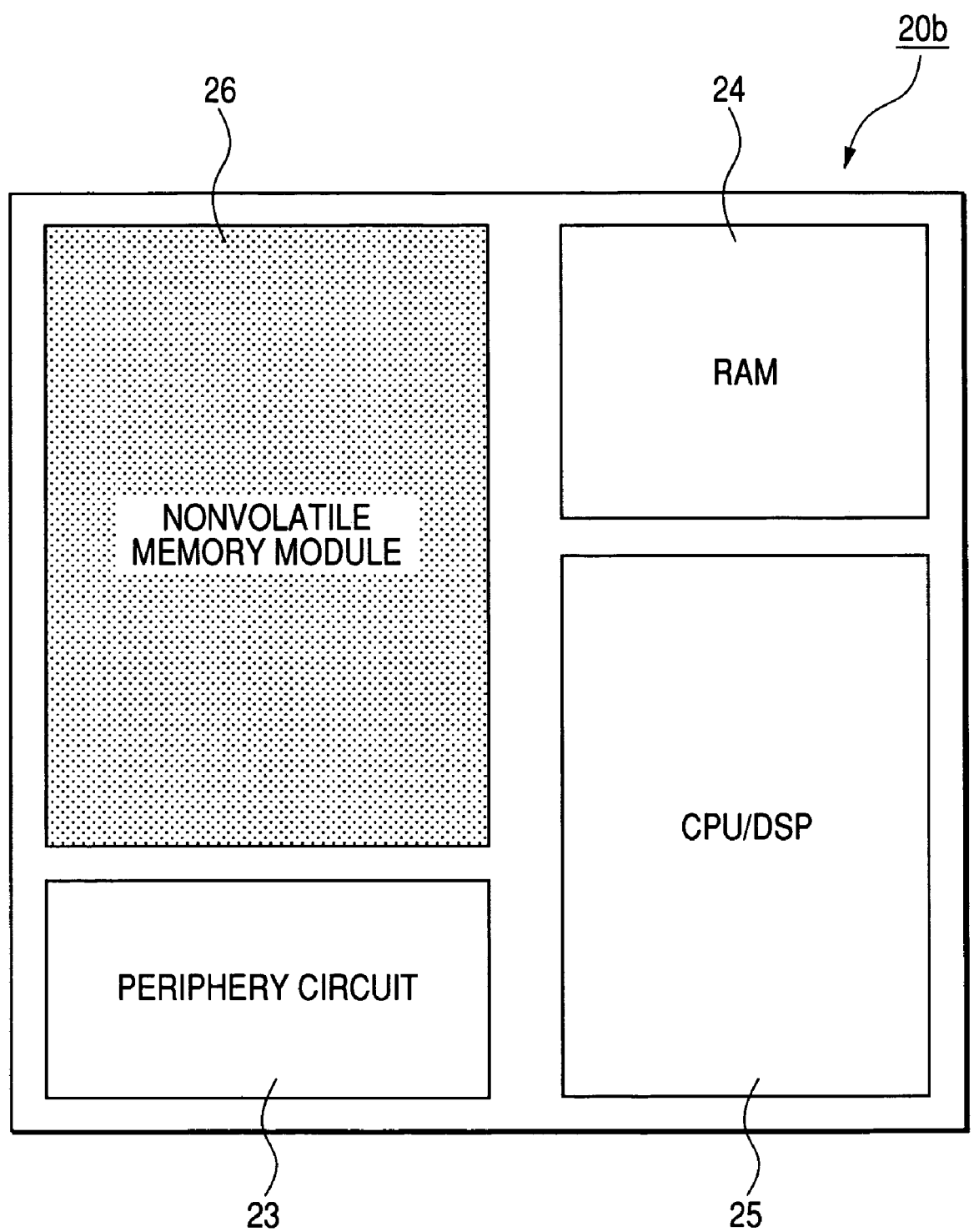
FIG. 17 is a plane layout chart of a microcomputer that is a second embodiment of the invention.
Figure 18:
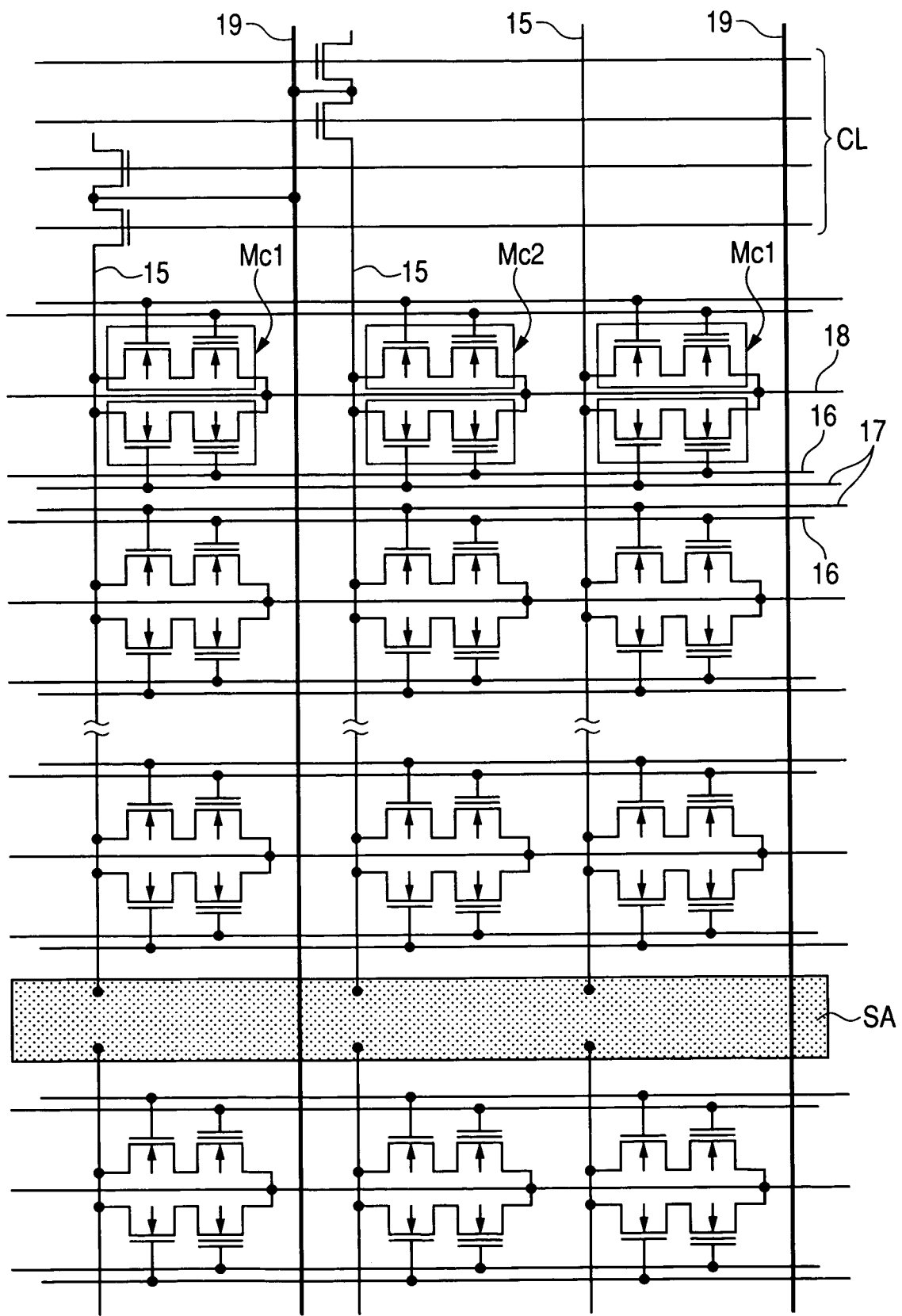
FIG. 18 is an equivalent circuit diagram showing a part of a nonvolatile memory module in FIG. 17.
Figure 19:
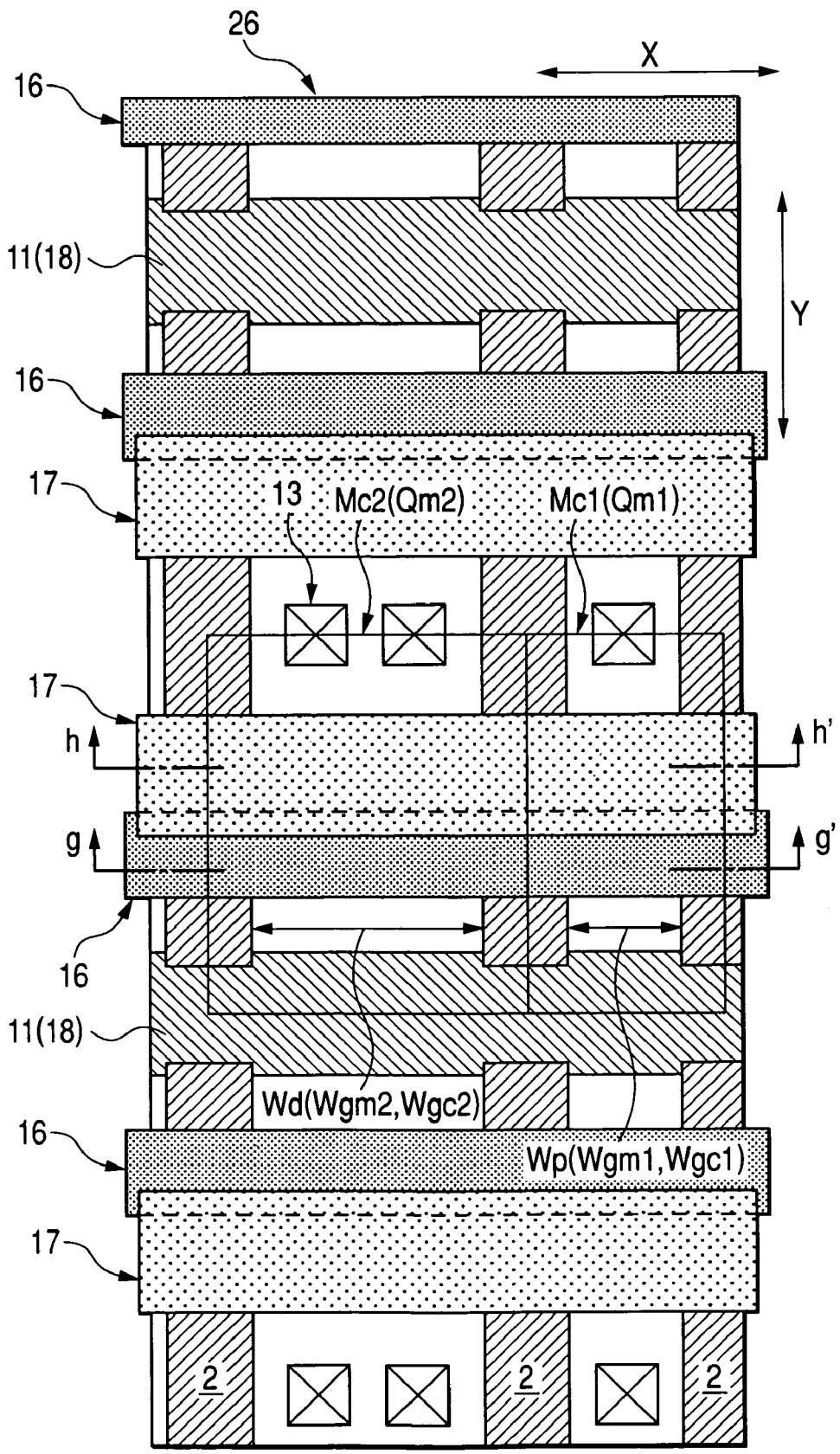
FIG. 19 is a schematic plan view showing the part of the nonvolatile memory module in FIG. 17.
Figure 20:
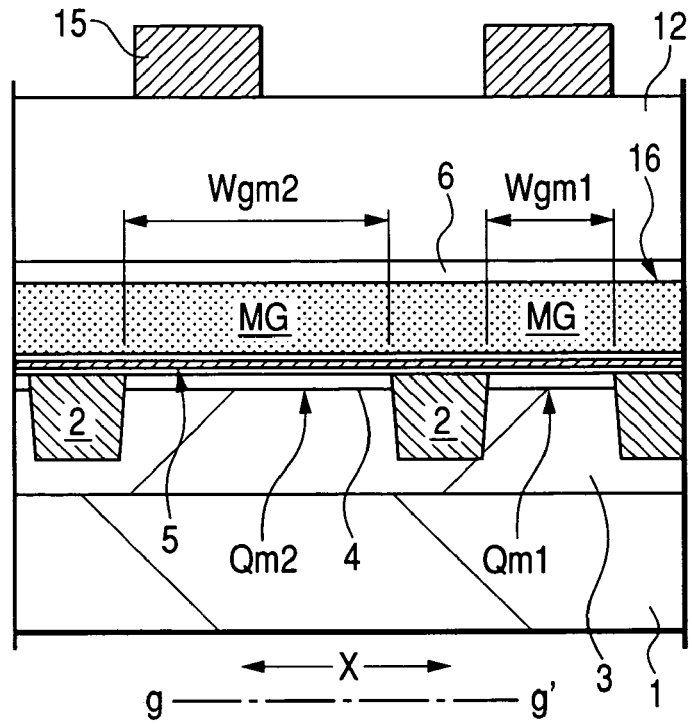
FIG. 20 is a schematic section view along a line g-g' of FIG. 19.

FIG. 17 to FIG. 21 are views according to a microcomputer that is the second embodiment of the invention; wherein, FIG. 17 is a plane layout chart of the microcomputer;

FIG. 18 is an equivalent circuit diagram showing a part of the nonvolatile memory module of FIG. 17;

FIG. 19 is a schematic plan view showing a part of the nonvolatile memory module of FIG. 17;

FIG. 20 is a schematic section view along a line g-g' of FIG. 19; and

Figure 21:
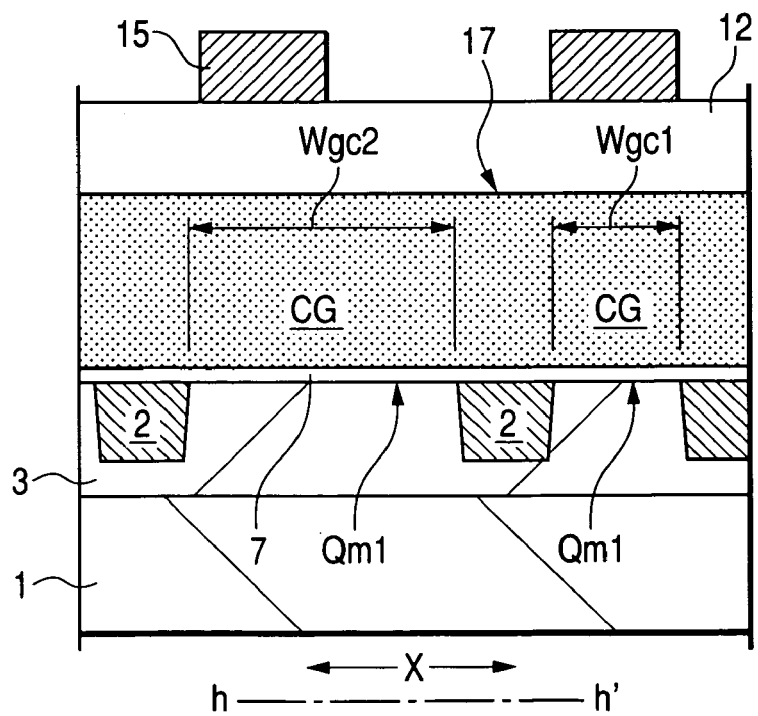
FIG. 21 is a schematic section view along a line h-h' of FIG. 19.

FIG. 21 is a schematic section view along a line h-h' of FIG. 19.

As shown in FIG. 17, in a microcomputer 20b of the second embodiment, a nonvolatile memory module 26, a peripheral circuit module 23, a RAM module 24, and a logic operation circuit module 25 are mounted on the main surface of the silicon substrate 1. Each of the modules is partitioned by an interconnection channel region.

As shown in FIG. 18 and FIG. 19, in the nonvolatile memory module 26, first cell arrays comprising multiple memory cells Mc1 (nonvolatile memory elements Qm1) disposed along the Y direction and second cell arrays comprising multiple memory cells Mc2 (nonvolatile memory elements Qm2) disposed along the Y direction are alternatively disposed along the X direction.

In the nonvolatile memory elements Qm1 and Qm2 adjacent to each together in the X direction, as shown in FIG. 19 and FIG. 20, each of the memory-gate electrodes MG is formed from a part of the gate interconnection 16 extending along the X direction, in other words, formed integrally with the gate interconnection 16. In addition, in the nonvolatile memory elements Qm1 and Qm2 adjacent to each together in the X direction, as shown in FIG. 19 and FIG. 21, each of the control-gate electrodes CG is formed from a part of the gate interconnection 17 extending along the X direction, in other words, formed integrally with the gate interconnection 17.

The nonvolatile memory element Qm1 is used for storing program data for operating a logic operation circuit such as CPU or DSP disposed in the logic operation circuit module 25. The nonvolatile memory element Qm2 is used for storing processed data that have been processed by executing the program. That is, the nonvolatile memory module 26 has a configuration where it has the nonvolatile memory elements Qm1 used for storing the program data and the nonvolatile memory elements Qm2 that are used for storing the processed data and have a gate width Wd larger than a gate width Wp of the nonvolatile memory elements Qm1 mounted together therein. That is, the module is formed such that a relation of Wd>Wp is made between the gate width (channel width) Wp of the nonvolatile memory element Qm1 and the gate width (channel width) Wd of the nonvolatile memory element Qm2.

In the microcomputer 20b configured in this way, the number of rewriting and the degree of integration can be improved as the first embodiment.

Moreover, since the sense amplifier SA is configured to be common to the nonvolatile memory elements Qm1 used for storing the program data and the nonvolatile memory elements Qm2 used for storing the processed data, the nonvolatile memory module can be made small compared with the module in the first embodiment.

Third Embodiment

While examples, where the invention is applied to the microcomputer having the nonvolatile memory element in which the electrons injected into the silicon nitride film of the charge-storage insulating film are emitted to the gate electrode for data erasing, was described in the first and second embodiments; an example, where hot holes are injected from the side of the channel formation region under the memory-gate electrode (substrate 1 side) into the silicon nitride film of the charge-storage insulating film for data erasing, is described in the third embodiment.

Figure 22:
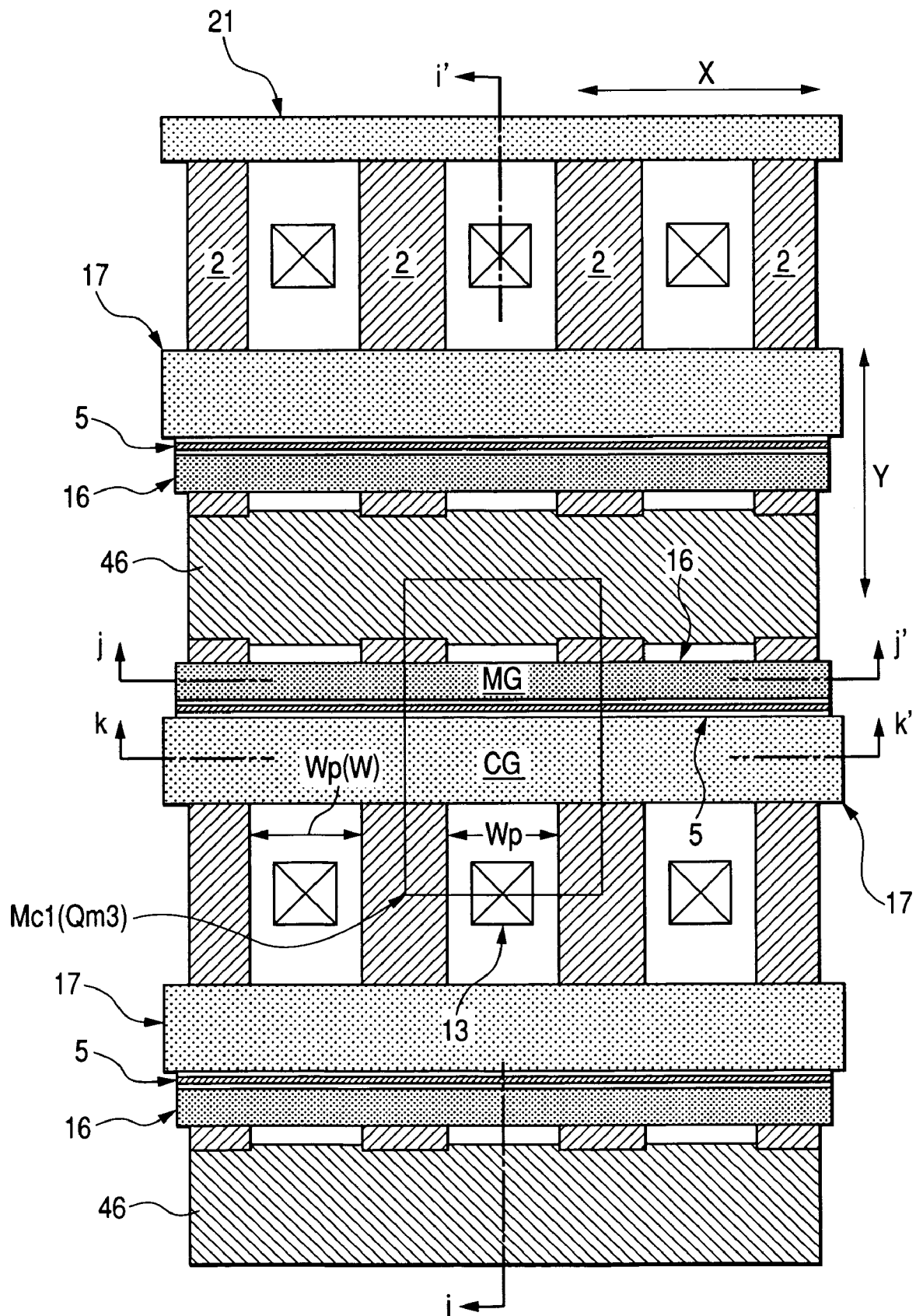
FIG. 22 is a schematic plan view showing a part of a program nonvolatile-memory-module mounted in a microcomputer that is a third embodiment of the invention.
Figure 23:
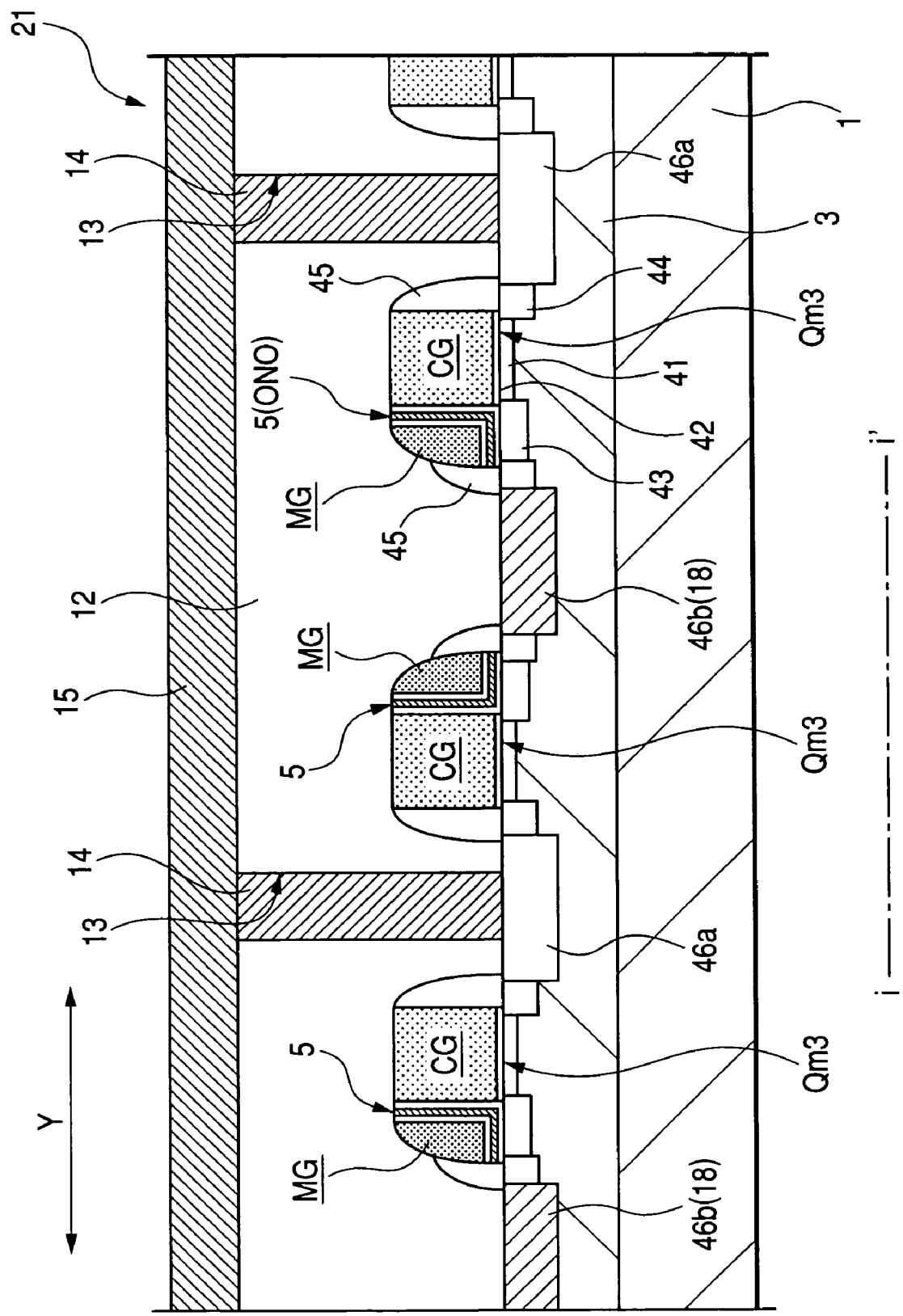
FIG. 23 is a schematic section view along a line i-i' of FIG. 22.
Figure 24:
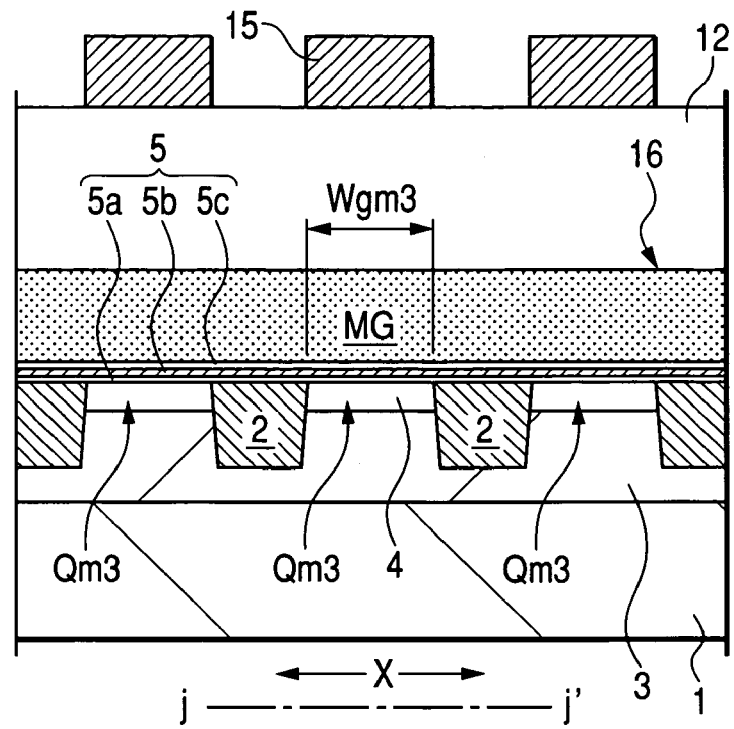
FIG. 24 is a schematic section view along a line j-j' of FIG. 22.
Figure 25:
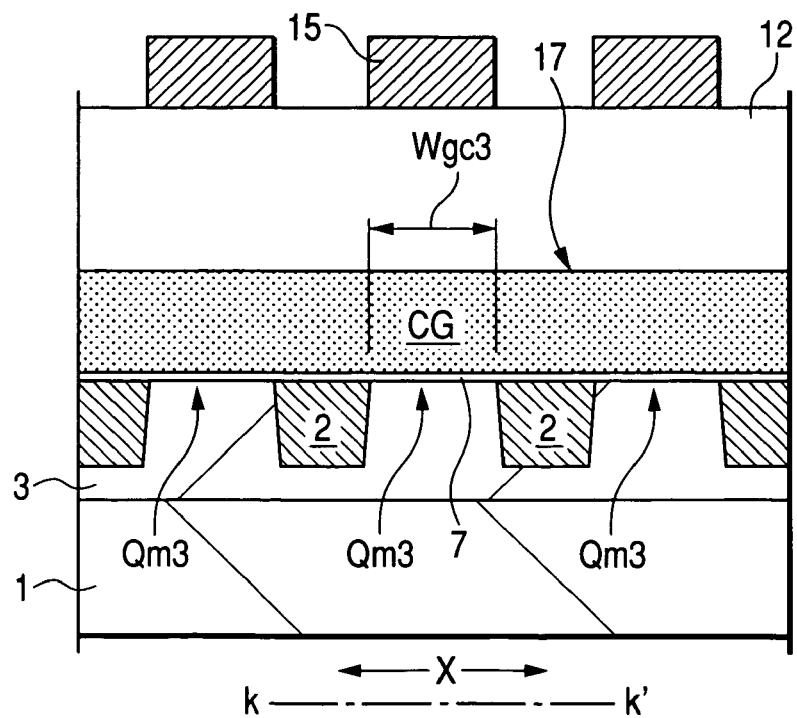
FIG. 25 is a schematic section view along a line k-k' of FIG. 22.
Figure 26:
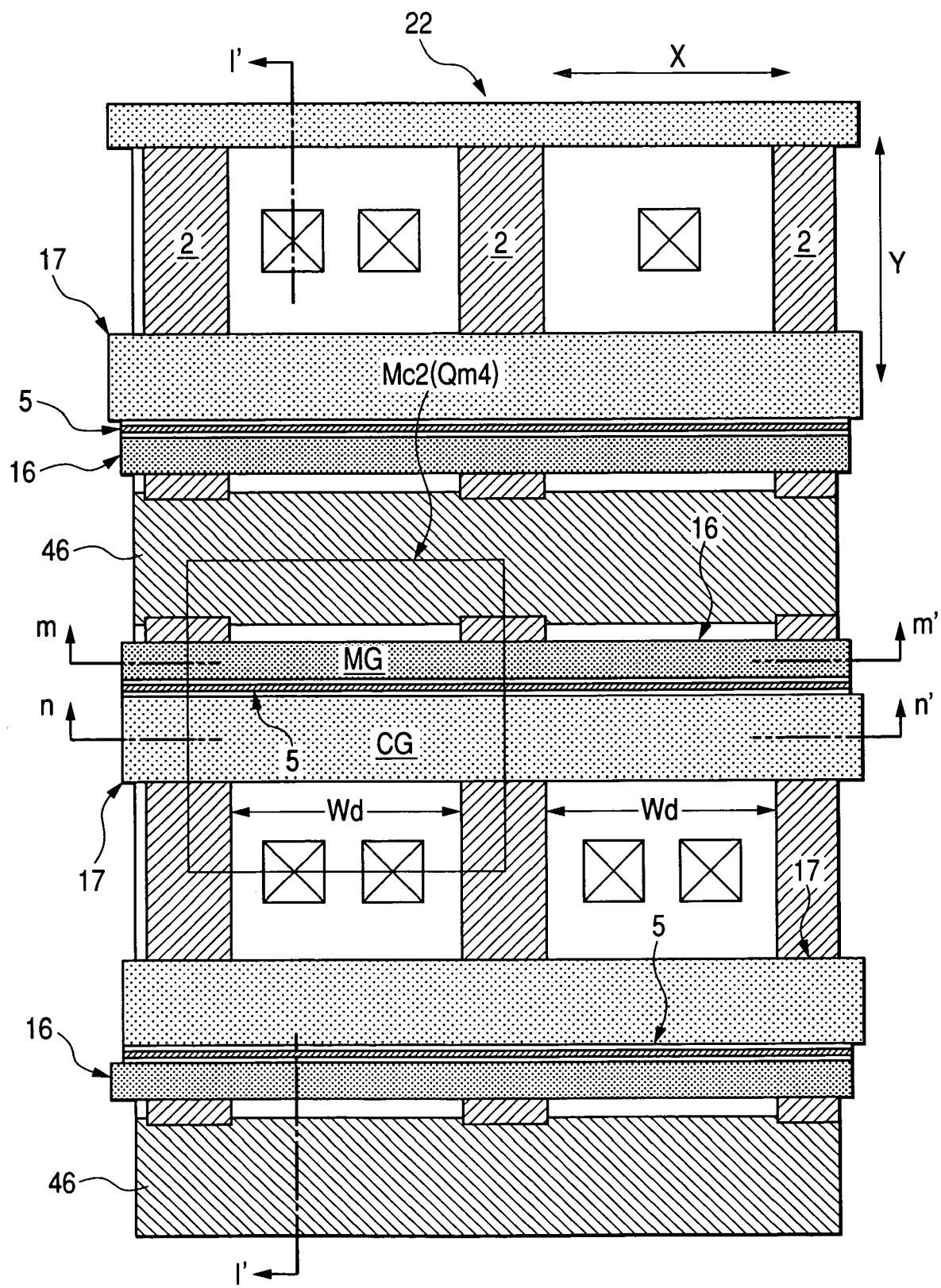
FIG. 26 is a schematic plan view showing a part of a data nonvolatile-memory-module mounted in the microcomputer that is the third embodiment of the invention.
Figure 27:
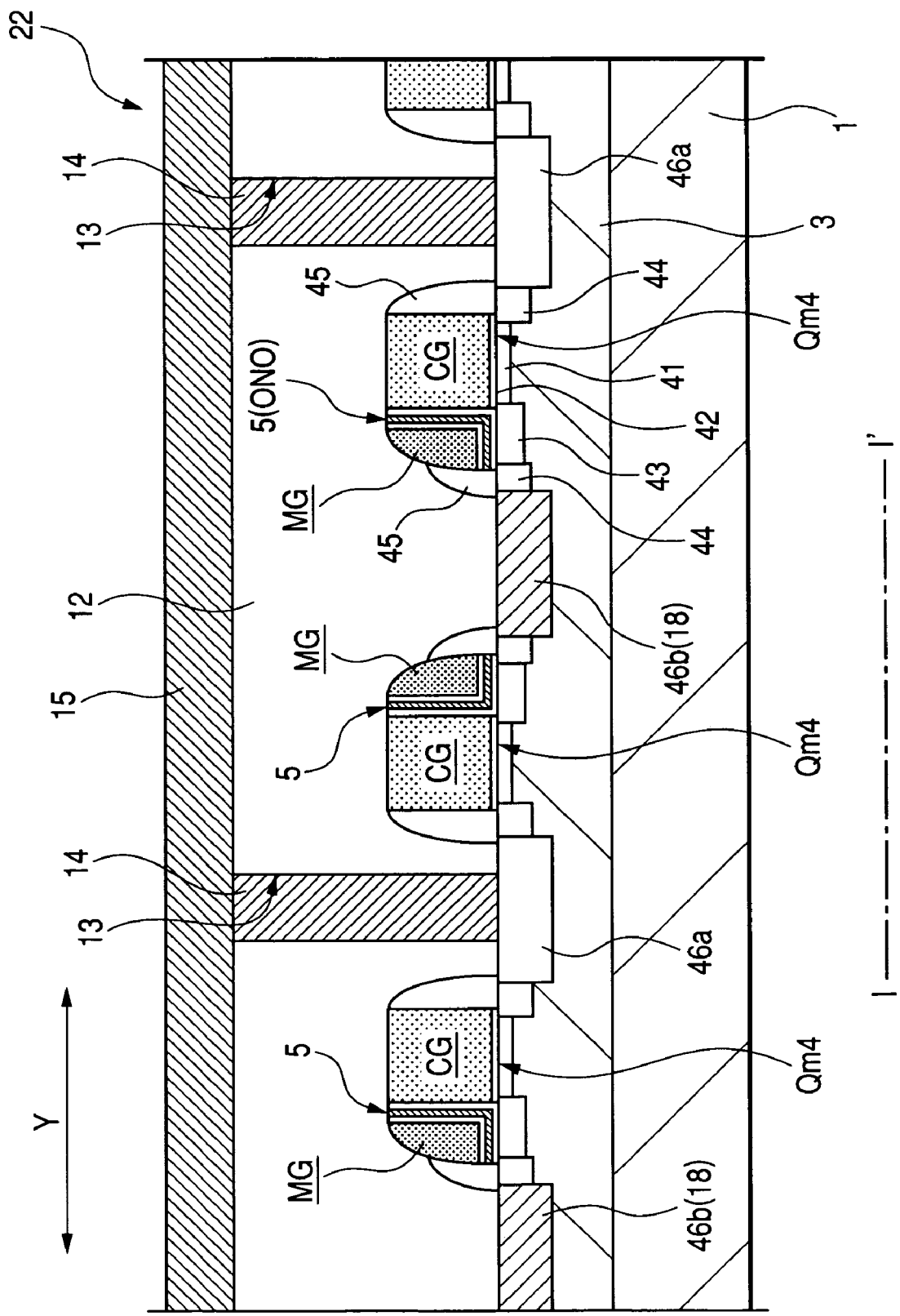
FIG. 27 is a schematic section view along a line 1-1' of FIG. 26.
Figure 28:
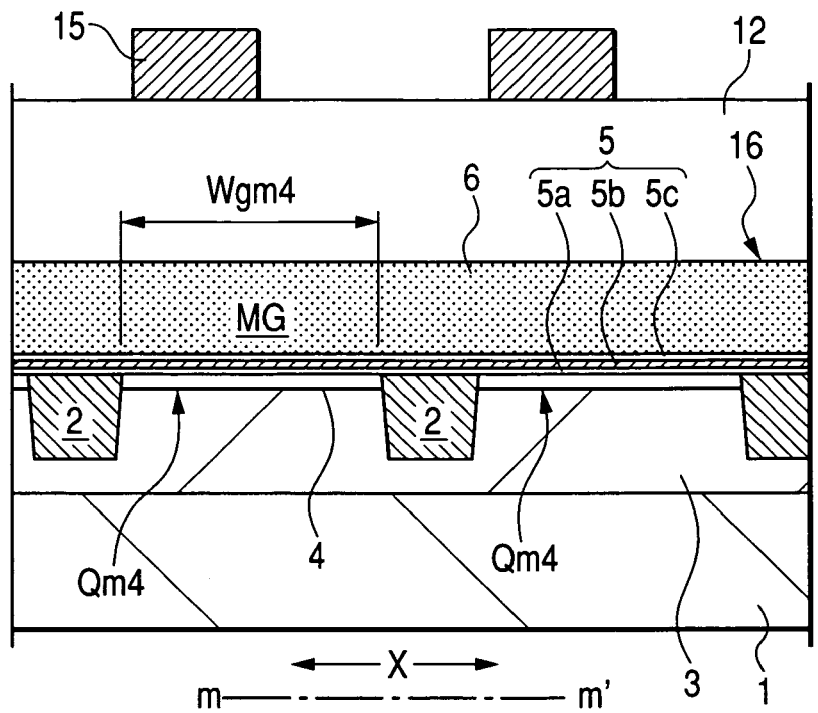
FIG. 28 is a schematic section view along a line m-m' of FIG. 26.

FIG. 22 to FIG. 29 are views according to a microcomputer that is the third embodiment of the invention; wherein, FIG. 22 is a schematic plan view showing a part of the program nonvolatile-memory-module mounted in the microcomputer;

FIG. 23 is a schematic section view along a line i-i' of FIG. 22;

FIG. 24 is a schematic section view along a line j-j' of FIG. 22;

FIG. 25 is a schematic section view along a line-k-k' of FIG. 22;

FIG. 26 is a schematic plan view showing a part of the data nonvolatile-memory-module mounted in the microcomputer;

FIG. 27 is a schematic section view along a line l-l' of FIG. 26;

FIG. 28 is a schematic section view along a line m-m' of FIG. 26; and

Figure 29:
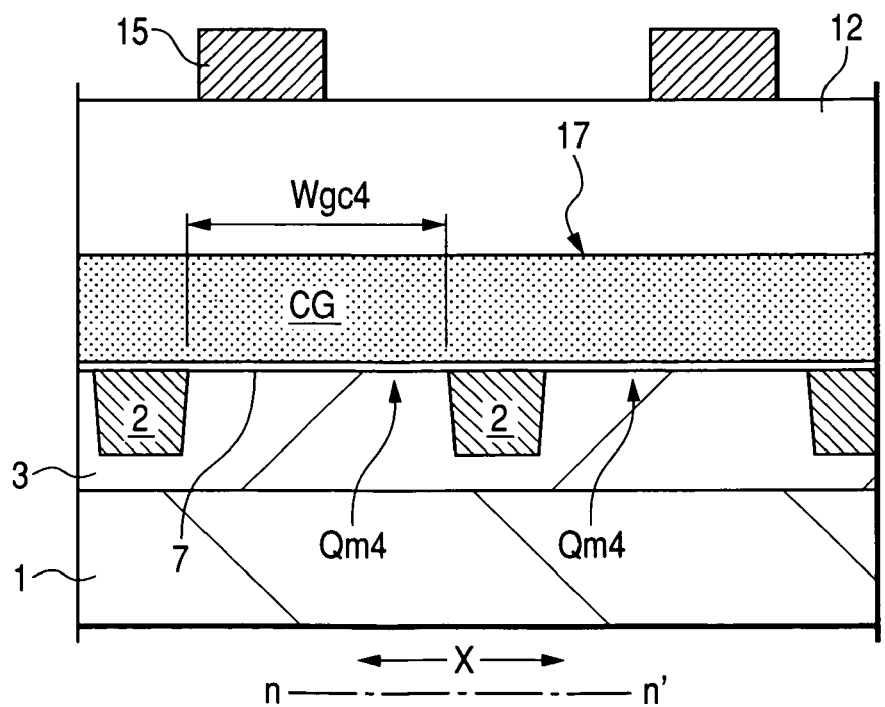
FIG. 29 is a schematic section view along a line n-n' of FIG. 26.

FIG. 29 is a schematic section view along a line n-n' of FIG. 26.

The microcomputer of the third embodiment has a configuration essentially similar to the microcomputer of the first embodiment, but the memory cells Mc1 and Mc2 have different element structures.

In the program nonvolatile-memory-module 21, multiple memory cells Mc1 shown in FIG. 22 are disposed in the matrix pattern. One memory cell Mc1 comprises one nonvolatile memory element Qm3 shown in FIG. 23. In the data nonvolatile-memory-module 22, multiple memory cells Mc2 shown in FIG. 26 are disposed in the matrix pattern. One memory cell Mc2 comprises one nonvolatile memory element Qm4 shown in FIG. 27.

As shown in FIG. 23, the nonvolatile memory element Qm3 is configured to have a channel formation region, a gate insulating film 42, a control-gate electrode CG, a charge-storage insulating film 5 that acts as the charge-storage section, a memory-gate electrode MG, and source and drain regions, and has a configuration where the control MISFET (pass transistor) and the MONOS FET are connected in series in the equivalent circuit.

The control-gate electrode CG is provided in the active region of the main surface of the silicon substrate 1 via a gate insulating film 42 comprising, for example, the silicon oxide film. The charge-storage insulating film 5 is provided at a side of one of the two sidewall faces located at opposite sides to each other in a channel length direction of the control-gate electrode CG along the one sidewall face and the main surface of the silicon substrate 1. The memory-gate electrode MG is provided next to the control-gate electrode CG, specifically at one of sidewall face sides of the control-gate electrode CG via the charge-storage insulating film 5 between the electrode MG and the silicon substrate 1, and between the electrode MG and the control-gate electrode CG. The control-gate electrode CG and the memory-gate electrode MG are disposed along their gate length directions, respectively.

The charge-storage insulating film 5 is formed from an ONO film (Oxide/Nitride/Oxide) film, and in the embodiment, formed from an ONO film comprising, for example, a silicon oxide (SiO) film 5a, silicon nitride (SiN) film 5b, and silicon oxide (SiO) film 5c disposed in this order from a side of the main surface of the silicon substrate 1.

At the other sidewall face side (at a side of a sidewall face opposite to the sidewall face on which the memory-gate electrode MG is provided) of the control-gate electrode CG, a sidewall spacer 45 formed in alignment with the control-gate electrode CG is provided, and outside the memory-gate electrode MG, a sidewall spacer 45 formed in alignment with the memory-gate electrode MG is provided. The sidewall spacers 45 are formed from an insulating film comprising, for example, the silicon oxide film.

The source and the drain regions are configured to have a pair of n-type semiconductor regions (extension region) 44 and a pair of n-type semiconductor regions (contact region) 46a, 46b. In the pair of n-type semiconductor regions 44, one of the n-type semiconductor regions 44 is provided on the main surface of the silicon substrate 1 in alignment with the control-gate electrode CG, and the other of the n-type semiconductor regions 44 is provided on the main surface of the silicon substrate 1 in alignment with the memory-gate electrode MG. In the pair of n-type semiconductor regions 46a, 46b, one n-type semiconductor region 46a is provided on the main surface of the silicon substrate 1 in alignment with the sidewall spacer 45 at the side of the control-gate electrode CG, and the other n-type semiconductor region 46b is provided on the main surface of the silicon substrate 1 in alignment with the sidewall spacer 45 outside the memory-gate electrode MG.

The channel formation region is provided immediately under the control-gate electrode CG and the memory-gate electrode MG, in other words, provided on the surface of the silicon substrate 1 between the source and drain regions. In the channel formation region, p-type semiconductor regions 41 and 43 are provided. The p-type semiconductor region 41 is provided in opposition to the control-gate electrode CG, and forms a p-n junction with the n-type semiconductor region 44 at the side of the control-gate electrode CG. The p-type semiconductor region 43 is provided in opposition to the memory-gate electrode MG and contacts to the p-type semiconductor region 41, and forms a p-n junction with the n-type semiconductor region 44 at the side of the memory-gate electrode MG.

In the nonvolatile memory elements Qm3 adjacent to each together in the Y direction, the drain region (n-type semiconductor region 46a) and the source region (n-type semiconductor region 46b) are combined. As shown in FIG. 22, the n-type semiconductor region 46b extends along the X direction and is used as the source interconnection 18.

In the nonvolatile memory elements Qm3 adjacent to each together in the X direction, respective memory-gate electrodes MG are formed from a part of the gate interconnections 16 extending along the X direction, as shown in FIG. 22 and FIG. 24, in other words, formed integrally with the gate interconnections 16. In addition, in the nonvolatile memory elements Qm3 adjacent to each together in the X direction, as shown in FIG. 22 and FIG. 25, respective control-gate electrodes CG are formed from a part of the gate interconnections 17 extending along the X direction, in other words, formed integrally with the gate interconnections 17.

As shown in FIG. 23 to FIG. 25, the nonvolatile memory elements Qm3 disposed in the program nonvolatile-memory-module 21 are covered with the interlayer insulating film 12 provided on the main surface of the silicon substrate 1, and the multiple sub-bit-lines 15 extending along the Y direction are disposed on the interlayer insulating film 12.

On the drain regions (n-type semiconductor regions 46a) of the nonvolatile memory elements Qm3 adjacent to each together in the Y direction, connection holes 13 running from a surface of the interlayer insulating film 12 to the n-type semiconductor regions 46a are provided, and conductive plugs 14 are filled in the connection holes 13. The drain regions (n-type semiconductor regions 46a) of the nonvolatile memory elements Qm3 adjacent to each together in the Y direction are electrically connected to the sub bit lines 15 extending over the interlayer insulating film 12 via the conductive plugs 14.

The data nonvolatile-memory-module 22 has a configuration essentially similar to the program nonvolatile-memory-module 21. In addition, the nonvolatile memory element Qm4 disposed in the data nonvolatile-memory-module 22 has a configuration essentially similar to the nonvolatile memory element Qm3, as shown in FIG. 27 to FIG. 29. However, a gate width (channel width) Wd of the nonvolatile memory element Qm4 is larger than a gate width (channel width) Wp of the nonvolatile memory element Qm3, as the first embodiment.

The nonvolatile memory elements Qm3 and Qm4 have a configuration where the MONOS FET and the control MISFET (pass transistor) are connected in series in the equivalent circuit, wherein when the hot electrons are injected into the trap in the silicon nitride film 5b in the charge-storage insulating film 5 under the memory-gate electrode MG, the threshold voltage of the MONOS FET (threshold voltage Vth at a point under the memory-gate electrode MG) is changed, and the threshold voltage of the entire system including the control MISFET and the MONOS FET which are connected in series (threshold voltage of the entire system including the threshold voltage at the control-gate electrode CG and the threshold voltage at the memory-gate electrode MG) is changed. That is, the nonvolatile memory elements Qm3 and Qm4 have a configuration where the charges are stored in the charge-storage insulating film 5, thereby the threshold voltage of the drain current flowing between the source and the drain is controlled for memory operation.

Writing to the nonvolatile memory elements Qm3 and Qm4 is performed by applying, for example, a voltage of 1 V to the n-type semiconductor region 46a of the drain region, 6 V to the n-type semiconductor region 46b of the source region, 12 V to the memory-gate electrode MG, 1.5 V to the control-gate electrode CG, and 0 V to the p-type well region 3, thereby injecting the hot electrons from the side of the channel formation region (substrate 1 side) under the memory-gate electrode MG into the silicon nitride film 5b of the charge-storage insulating film 5. The injection of the hot electrons is performed by allowing the electrons to pass through the silicon oxide film 5a as the bottom layer of the charge-storage insulating film 5.

Erasing of the nonvolatile memory elements Qm3 and Qm4 is performed by applying, for example, a voltage of 0 V to the drain region, 7 V to the source region, −6 V to the memory-gate electrode MG, and 0 V to the control-gate electrode CG and the p-type well region 3 respectively, thereby allowing hot holes to pass through the silicon oxide film 5a as the bottom layer of the charge-storage insulating film 5 and injecting the holes from the side of the channel formation region (substrate 1 side) under the memory-gate electrode MG into the silicon nitride film 5b of the charge-storage insulating film 5.

Reading from the nonvolatile memory elements Qm3 and Qm4 is performed by applying, for example, an electric potential of 0 V to the source region, 1.5 V to the drain region, 1.5 V to the memory-gate electrode MG and the control-gate electrode CG, and 0 V to the p-type well region 3, respectively.

A gate width Wgm4 of the nonvolatile memory element Qm4 under the memory-gate electrode MG (see FIG. 28) is larger than a gate width Wgm3 of the nonvolatile memory element Qm3 under the memory-gate electrode MG (see FIG. 24); and a gate width Wgc4 of the nonvolatile memory element Qm4 under the control-gate electrode CG (see FIG. 29) is larger than a gate width Wgc3 of the nonvolatile memory element Qm3 under the control gate electrode CG (see FIG. 25). That is, the gate width (channel width) Wd of the nonvolatile memory element Qm4 is larger than the gate width (channel width) Wp of the nonvolatile memory element Qm3. In the third embodiment, the gate width of the nonvolatile memory element Qm4 is, for example, about three times the gate width of the nonvolatile memory element Qm3.

In the program nonvolatile-memory-module 21 and the data nonvolatile-memory-module 22, as shown in FIG. 24 and FIG. 25, and FIG. 28 and FIG. 29, the gate interconnections 16 and 17 extend over the active regions and the element isolation regions 2. Therefore, in the nonvolatile memory elements Qm3 and Qm4, the gate width Wgm3, Wgm4 under the memory-gate electrode MG and the gate width Wgc3, Wgc4 under the control-gate electrode CG are defined by the element isolation regions 2. The gate length under the memory-gate electrode MG and the gate length under the control-gate electrode CG are defined by length between the source and drain regions. In the third embodiment, the gate lengths of the nonvolatile memory elements Qm3 and Qm4 are, for example, about 0.25 µm, the gate width of the nonvolatile memory element Qm3 is, for example, about 0.3 µm, and the gate width of the nonvolatile memory element Qm4 is, for example, about 1.0 µm.

The nonvolatile memory element Qm3 disposed in the program nonvolatile-memory-module 21 is used for storing the program data for operating the logic operation circuit such as CPU or DSP disposed in the logic operation circuit module 25. The nonvolatile memory element Qm4 disposed in the data nonvolatile-memory-module 22 is used for storing the processed data which have been processed by executing the program.

Here, the rewriting number of the MONOS nonvolatile-memory-element is described.

Figure 30:
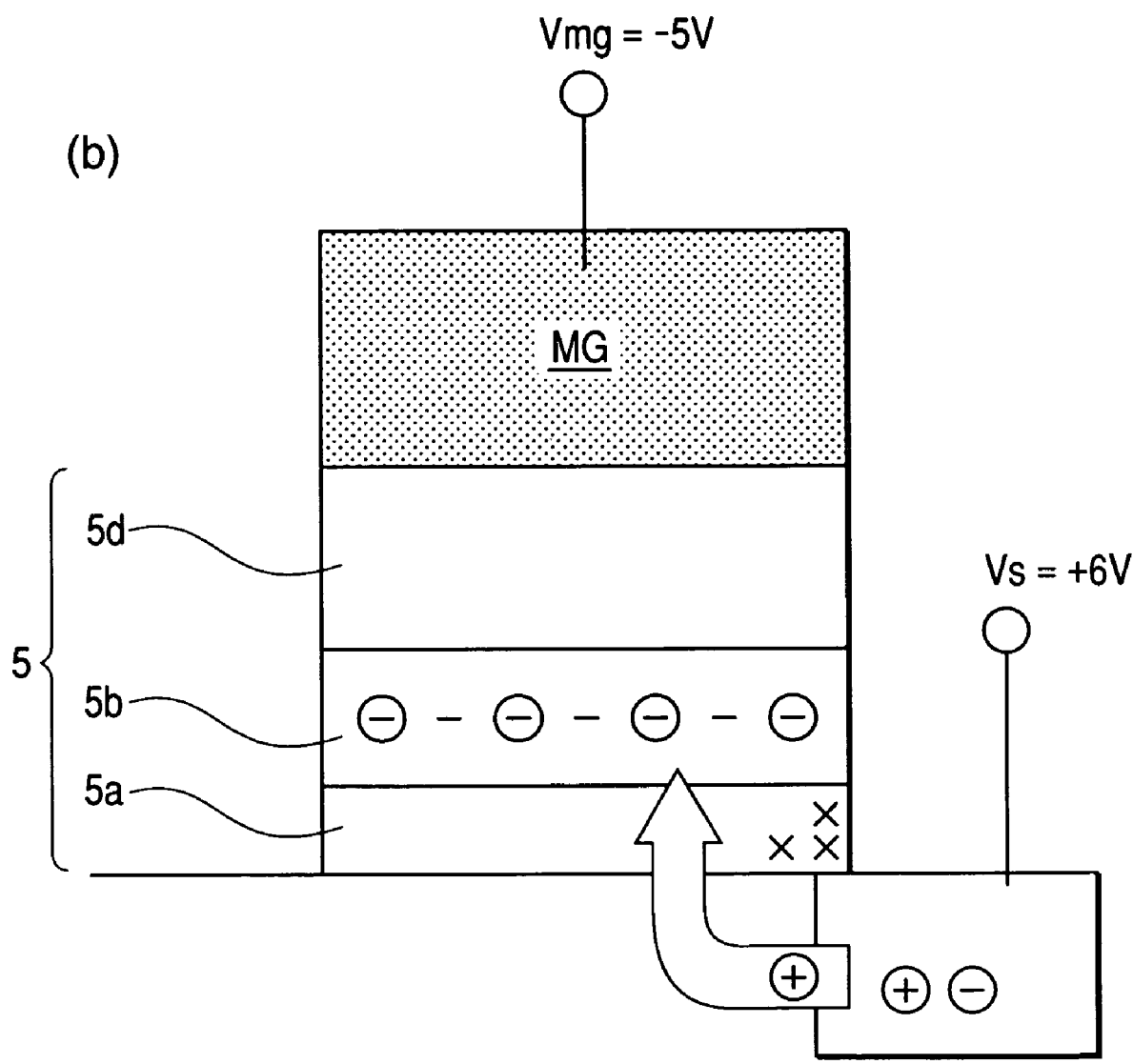
FIG. 30 is a view showing a deterioration model of the charge-storage insulating film due to erasing of the nonvolatile memory element.

In the nonvolatile memory element Qm3 of the third embodiment, data writing is performed by injecting the hot electrons from the side of the channel formation region (substrate 1 side) under the memory-gate electrode MG into the silicon nitride film 5$b$ of the charge-storage insulating film 5, and data rewriting is performed by allowing hot holes to pass through the silicon oxide film 5$a$ as the bottom layer of the charge-storage insulating film 5 and injecting the holes from the side of the channel formation region (substrate 1 side) under the memory-gate electrode MG into the silicon nitride film 5$b$ of the charge-storage insulating film 5. In such a nonvolatile memory element Qm3, the rewriting time increases in orders of magnitude at about 1000 times as the nonvolatile memory element Qm1, therefore the rewriting operation as a product becomes impossible. This is considered to be due to the deterioration of the charge-storage insulating film in erasing. Since the data erasing is performed using the hot hole injection from an edge of the source region in the nonvolatile memory element Qm3, the deterioration is considered to be mainly deterioration of the silicon oxide film 5$a$ as shown in FIG. 30.

Similarly in the nonvolatile memory element Qm3, the number of rewriting effectively increased in two orders or more of magnitude can be ensured by increasing the gate width W (width of the memory cell) about three times.

The nonvolatile memory element Qm3 having the small gate width W is used for storing the program data which is scarcely rewritten, and the nonvolatile memory element Qm4 having the large gate width W is used for storing the processed data which is frequently rewritten, thereby the reduction in the degree of integration due to increasing the gate width W of the nonvolatile memory element can be restrained, or the degree of integration can be improved compared with the case that the nonvolatile memory element Qm4 having the large gate width W is used for storing the program data which is scarcely rewritten, and for storing the processed data which is frequently rewritten.

In this way, according to the third embodiment, the number of rewriting and the degree of integration of the microcomputer can be similarly improved.

While an example, where the nonvolatile memory module was configured in a way that the program nonvolatile-memory-module and the data nonvolatile-memory-module were separately formed as the first embodiment, was shown in the third embodiment; one nonvolatile-memory-module can be naturally configured by mounting the two memory modules together as the second embodiment, and the same advantages as the second embodiment can be obtained.

Fourth Embodiment

While an example, where the nonvolatile memory element having the small gate width W is used for storing the program data which is scarcely rewritten, and the nonvolatile memory element having the large gate width W is used for storing the processed data which is frequently rewritten, was shown in the third embodiment; in the fourth embodiment, the two nonvolatile memory elements have a same gate width W, and one bit is formed from one nonvolatile memory element in the nonvolatile memory cell for storing the program data, and one bit is formed from multiple nonvolatile-memory-elements in the nonvolatile memory cell for data.

In the fourth embodiment, as the second embodiment, description is made according to an example where the nonvolatile memory element used for storing the program data and the nonvolatile memory element used for storing the processed data are mounted together to form one nonvolatile-memory-module as shown in FIG. 17.

Figure 31:
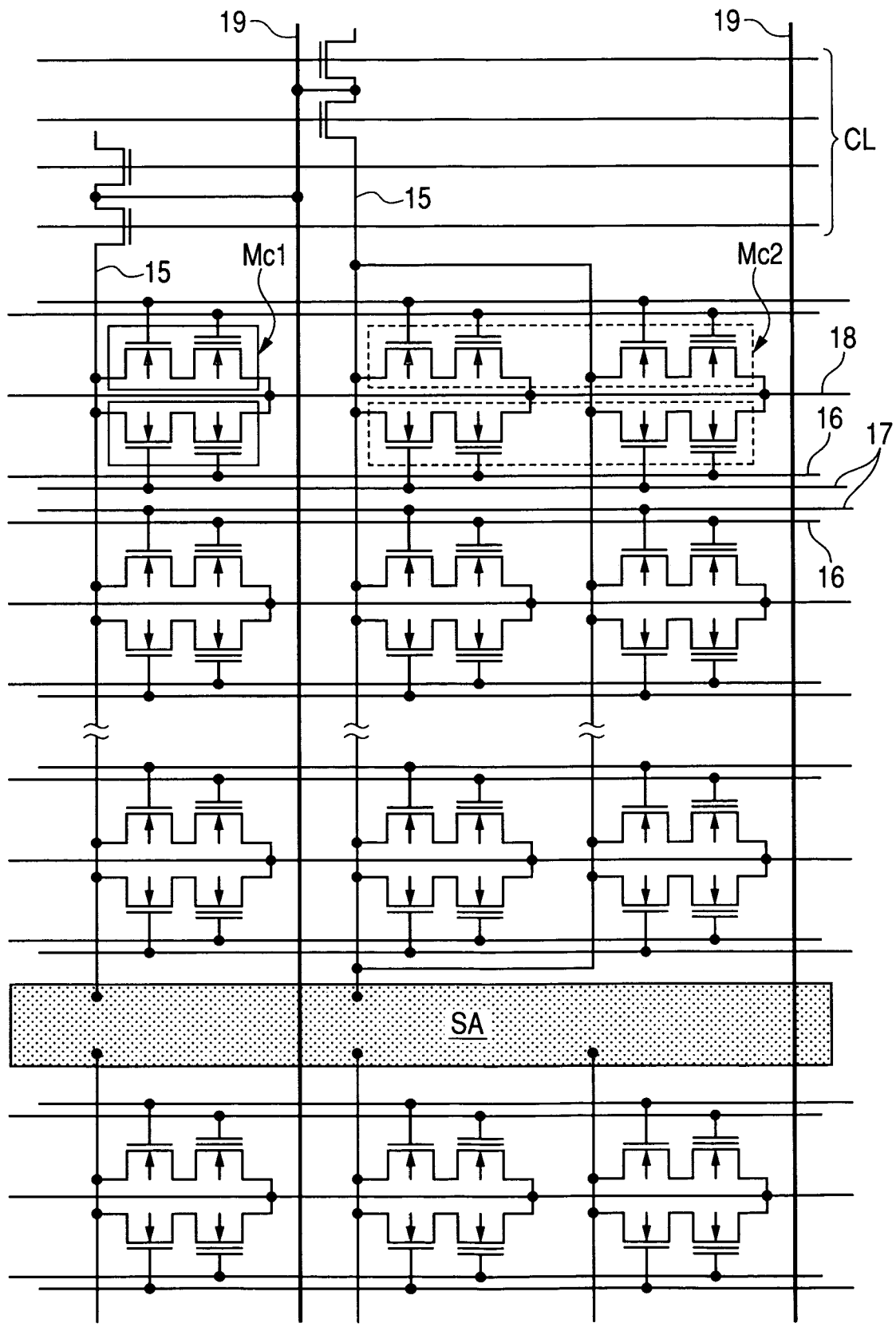
FIG. 31 is an equivalent circuit diagram showing a part of a nonvolatile memory module of a fourth embodiment.
Figure 32:
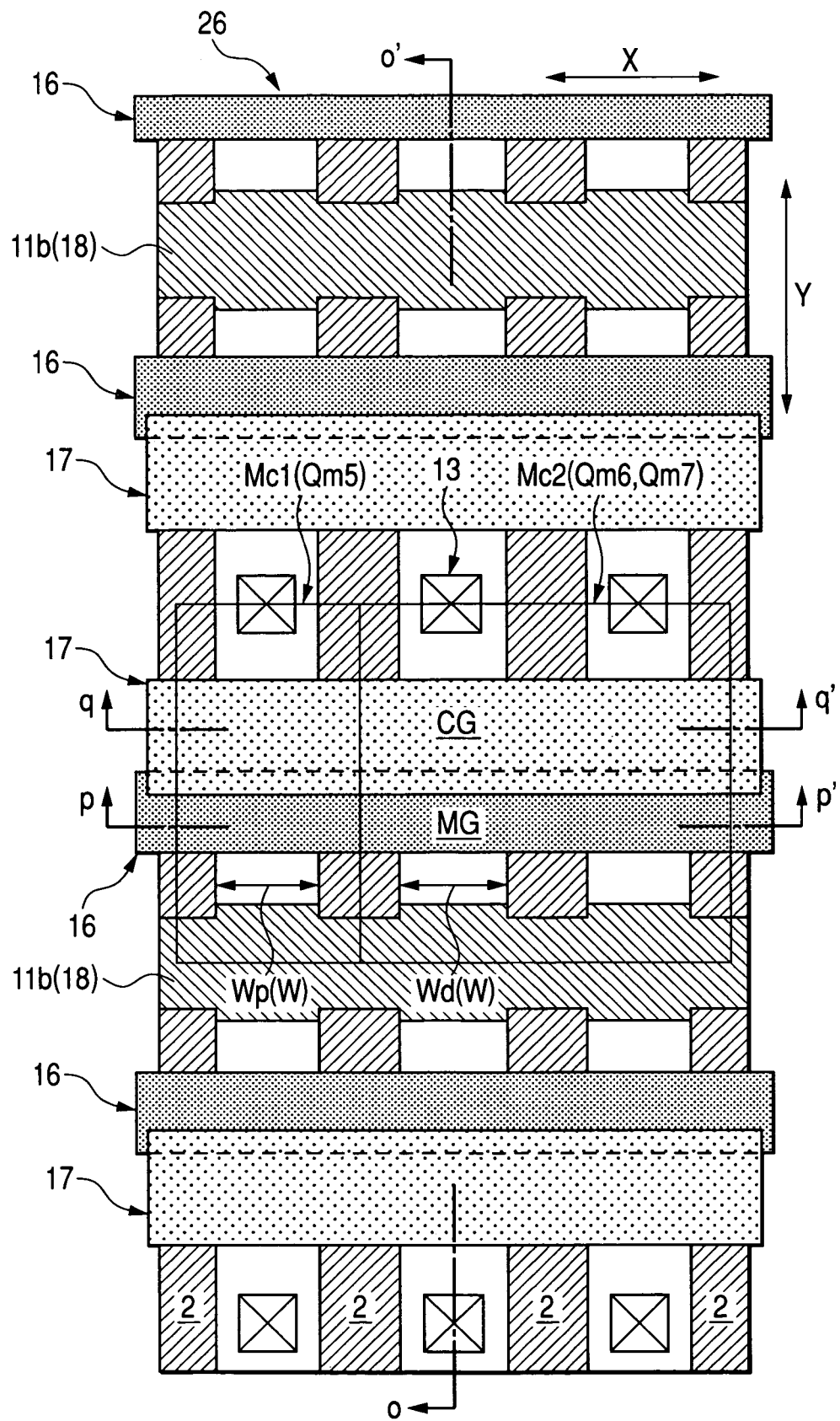
FIG. 32 is a schematic plan view showing a part of the nonvolatile memory module of FIG. 31.
Figure 33:
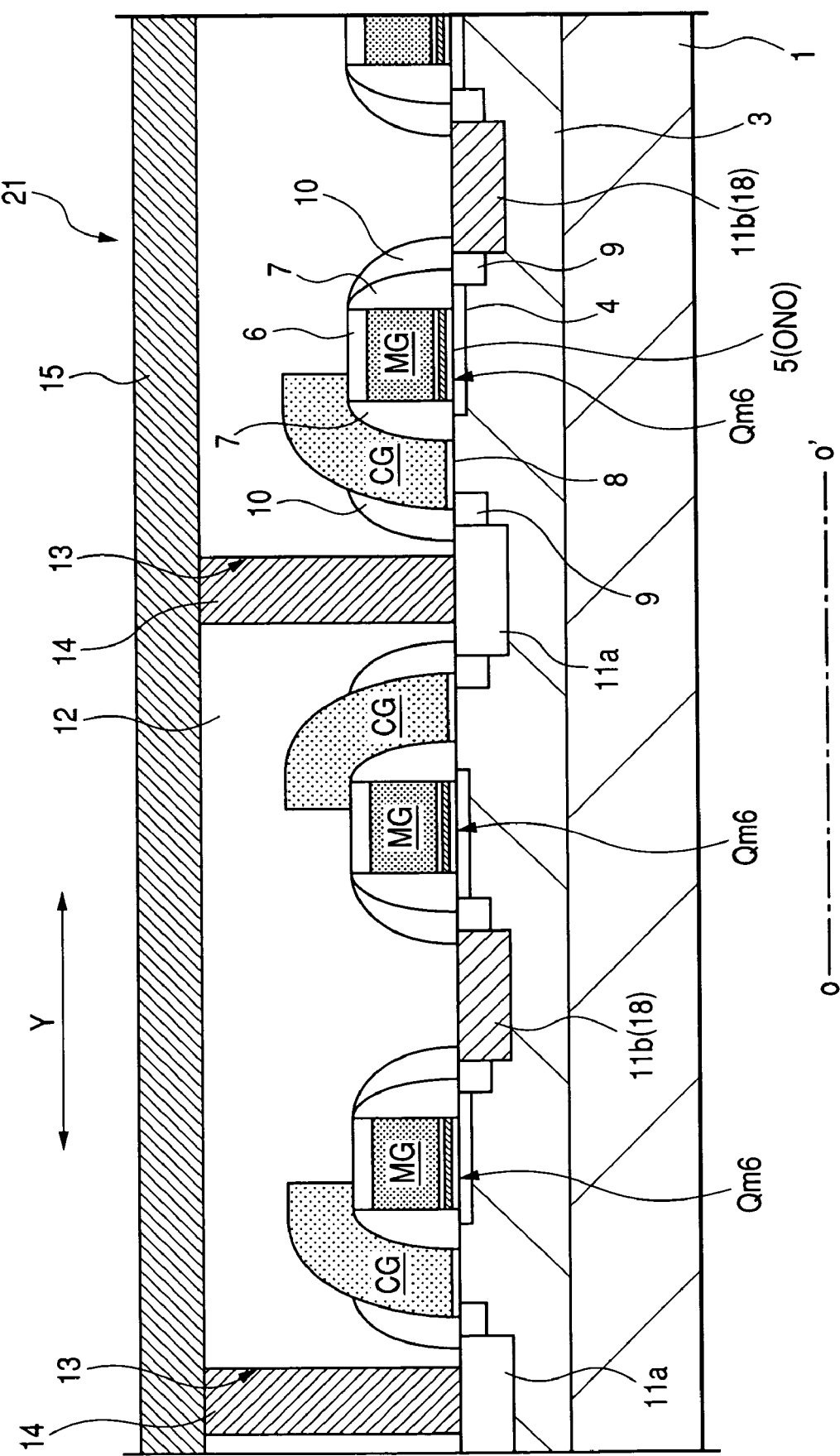
FIG. 33 is a schematic section view along a line o-o' of FIG. 32.
Figure 34:
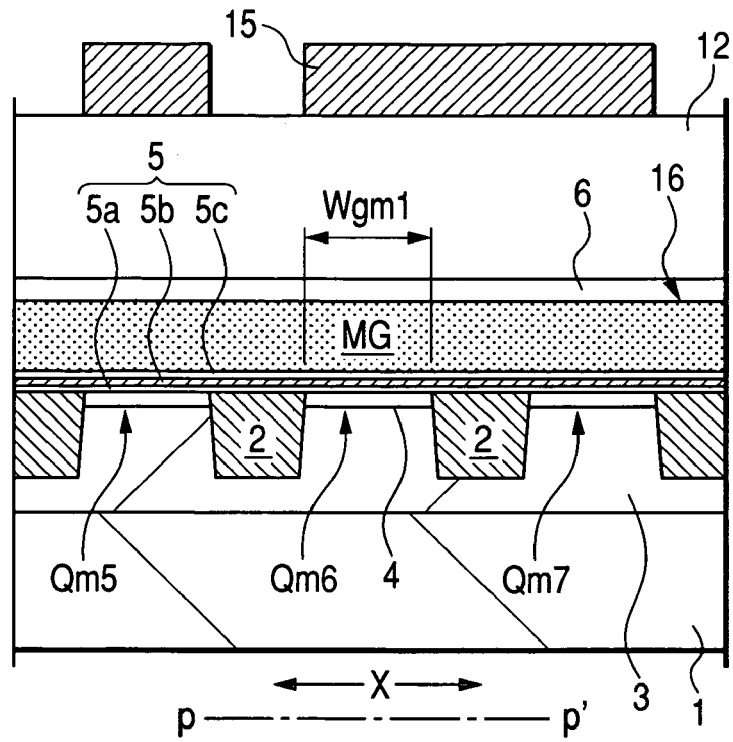
FIG. 34 is a schematic section view along a line p-p' of FIG. 32.
Figure 35:
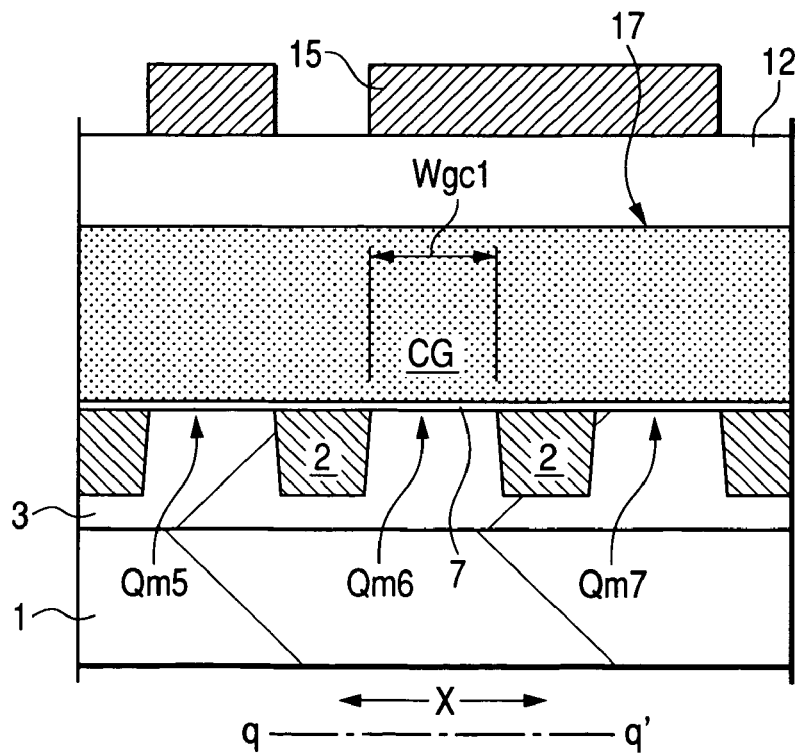
FIG. 35 is a schematic section view along a line q-q' of FIG. 32.

FIG. 31 to FIG. 36 are views according to a microcomputer that is the fourth embodiment of the invention; wherein, FIG. 31 is an equivalent circuit diagram showing a part of a nonvolatile memory module;

FIG. 32 is a plane layout chart of the nonvolatile memory module of FIG. 31;

FIG. 33 is a schematic section view along a line o-o' of FIG. 32;

FIG. 34 is a schematic section view along a line p-p' of FIG. 32;

FIG. 35 is a schematic section view along a line q-q' of FIG. 32; and

Figure 36:
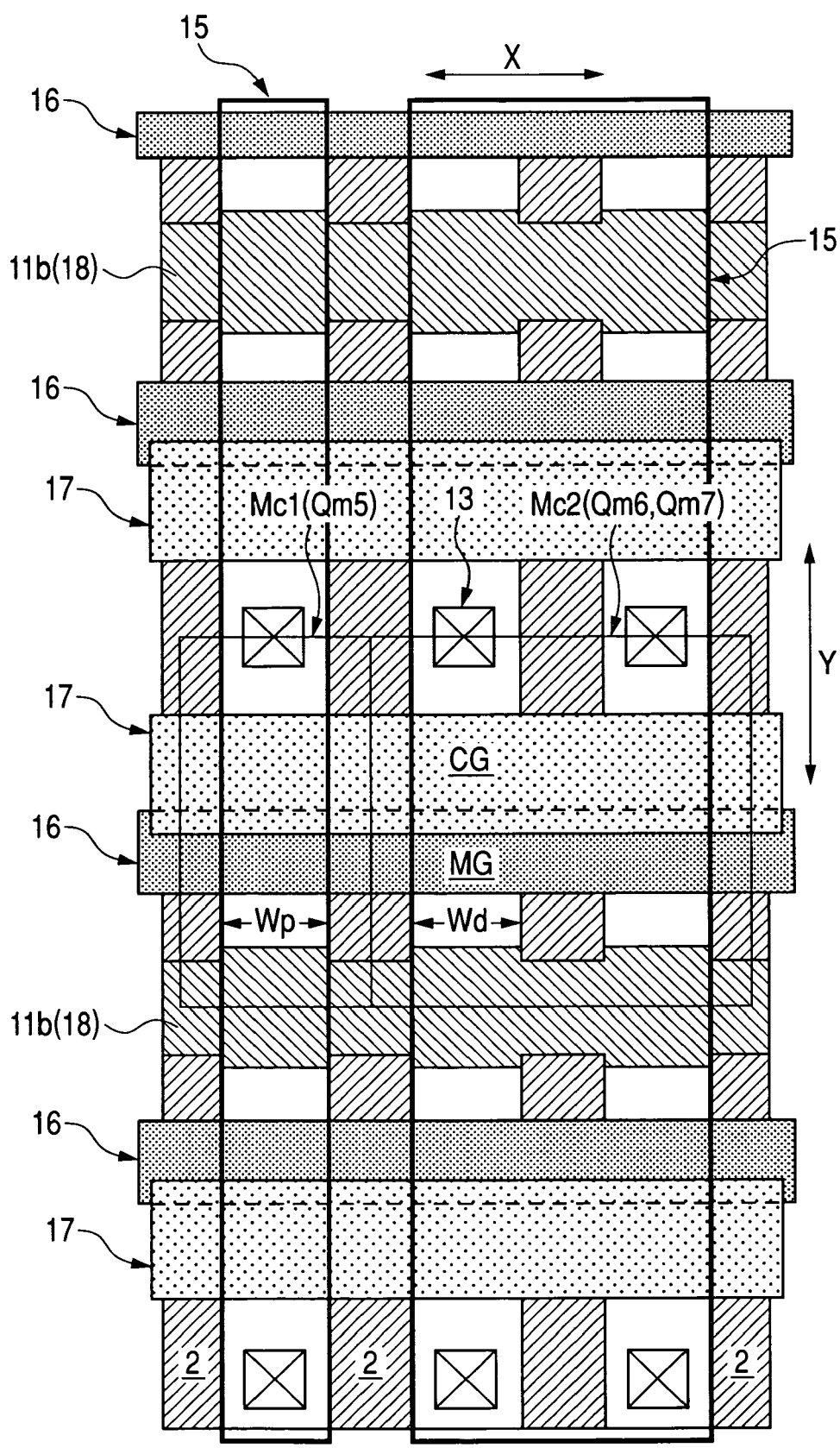
FIG. 36 is a schematic plan view showing connection of sub bit lines to the nonvolatile memory module of FIG. 31.

FIG. 36 is a schematic section view showing connection of the nonvolatile memory module of FIG. 31 to sub bit lines.

As shown in FIG. 31 and FIG. 32, in the nonvolatile memory module, first cell arrays comprising multiple memory cells Mc1 (nonvolatile memory elements Qm5) disposed along the Y direction and second cell arrays comprising multiple memory cells Mc2 (two nonvolatile memory elements Qm6, Qm7) disposed along the Y direction are alternatively disposed along the X direction. Each of the nonvolatile memory elements Qm5, Qm6 and Qm7 has the same structure as the nonvolatile memory elements Qm1 described in the first embodiment, and is formed in the same process. That is, various sizes of it including the gate width W are the same as in the element Qm1.

The memory cell Mc1 is configured to include the nonvolatile memory element Qm5, and used for storing the program data as the first to third embodiments.

The memory cell Mc2 is configured to include the multiple nonvolatile memory elements Qm6 and Qm7, and used for storing the processed data as the first to third embodiments. In the nonvolatile memory elements Qm6 and Qm7, while gate interconnections 16 integrally formed with the control-gate electrodes CG of them, gate interconnections 17 integrally formed with the memory-gate electrodes MG, and source lines 18 are in common with the nonvolatile memory elements Qm5, sub bit lines 15 are provided separately from those for the nonvolatile memory elements Qm5, and electrically connected to the sense amplifiers SA provided in correspondence with respective sub-bit-lines 15.

Here, as shown in FIG. 31, the sub bit lines 15 for the memory cells Mc2 are common to the nonvolatile memory elements Qm6 and Qm7. As shown in FIG. 36, a connection method is realized by, for example, making electric connection from the metal interconnections (sub bit lines) 15 running above the memory cells Mc2 to the drain regions of the nonvolatile memory elements Qm6 and Qm7 via the plugs 14. The sub bit lines for the nonvolatile memory elements Qm6 and Qm7 are formed in common, thereby voltage relations in erasing and reading become identical between the nonvolatile memory elements Qm6 and Qm7. Therefore, an effective channel width of the memory cell Mc2 can be made large with respect to the memory cell Mc1.

Figure 37:
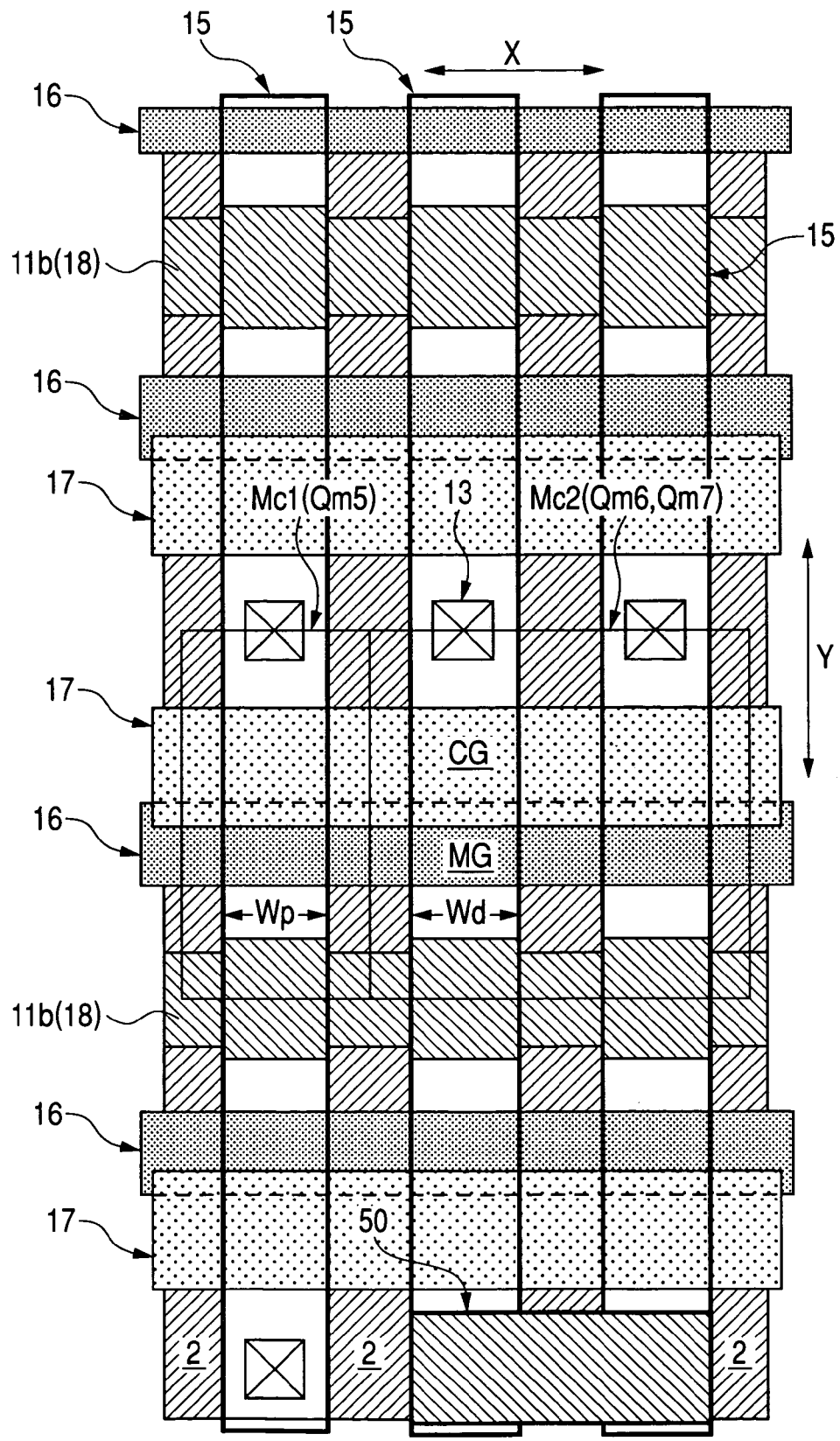
FIG. 37 is a schematic plan view showing a modification of FIG. 31.

Although an example where the metal interconnections (sub bit lines) 15 are formed above the nonvolatile memory elements Qm6 and Qm7 in a covering manner was shown, as shown in FIG. 37, a method where the metal interconnections (sub bit lines) 15 running above respective nonvolatile memory elements Qm6 and Qm7 are partially shunted by other interconnections 50 can be considered. In this way, interconnection layout is not limited to the matters described in the embodiment, and various modifications can be made according to design items.

In this way, in the fourth embodiment, the gate width (channel width W) of the data nonvolatile-memory-cell of the memory cell Mc2 can be effectively determined only by changing the interconnection layout without changing the structure of the nonvolatile memory element Qm of each of the memory cells Mc1 and Mc2. Accordingly, the gate width W of the data nonvolatile-memory-cell can be set large, and memory capacity can be easily allocated between the program nonvolatile-memory-cell and the data nonvolatile-memory-cell, therefore resistance to rewriting can be improved in the data nonvolatile-memory-cell.

In addition, an example where the sub bit lines 15 for the two nonvolatile memory elements Qm6 and Qm7 are formed in common was shown in the fourth embodiment, the sub bit lines 15 can be naturally formed in common to three nonvolatile memory elements or more. Therefore, a nonvolatile memory cell in which a desired rewriting number can be obtained can be easily designed.

On the other hand, it is feared in the fourth embodiment that since the element isolation region is necessary in the memory cell Mc2, the degree of integration of the data nonvolatile memory may be reduced compared with the cases described in the first to third embodiments. Therefore, it is desirable that the invention is appropriately used depending on a preferred use according to balance among the degree of integration, reliability and production cost.

Although the fourth embodiment has been described based on the second embodiment, it is not particularly limited to this, and can be naturally used in another embodiment including the first or third embodiment, and the same advantages as in the embodiments can be obtained.

Hereinbefore, while the invention made by the inventor has been specifically described according to the embodiments, the invention is not limited to the embodiments, and it is natural that various modifications can be made within a scope without departing from gist of the invention.

What is claimed is:

1. A semiconductor device having multiple nonvolatile memory elements in which first gate electrodes are provided on a main surface of a semiconductor substrate via a charge-storage film,
   a first nonvolatile memory cell comprising one nonvolatile memory element of the multiple nonvolatile memory elements, and
   a second nonvolatile memory cell comprising at least two nonvolatile memory elements of the multiple nonvolatile memory elements,
   wherein a rewriting frequency of the second nonvolatile memory cell is greater than a rewriting frequency of the first nonvolatile memory cell,
   wherein, in the first nonvolatile memory cell, one bit is formed from the one nonvolatile memory element, and
   wherein, in the second nonvolatile memory cell, one bit is formed from the at least two nonvolatile memory elements.

2. The semiconductor device according to claim 1,
   wherein the first nonvolatile memory cell is used for storing data forming a program,
   and the second nonvolatile memory cell is used for storing data processed by executing the program.

3. The semiconductor device according to claim 1,
   wherein the nonvolatile memory elements forming the first nonvolatile memory cell and the second nonvolatile memory cell have equal gate width.

4. The semiconductor device according to claim 1,
   wherein, for the at least two nonvolatile memory elements forming the second nonvolatile memory cell, respective bit lines are electrically connected using an interconnection disposed above the second nonvolatile memory cell.

5. The semiconductor device according to claim 1,
   wherein the charge-storage film is a film including a silicon nitride film.

6. A semiconductor device comprising first, second and third nonvolatile memory elements each including a first gate electrode formed over a semiconductor substrate via a charge storage film, a source region and a drain region,
   wherein a first nonvolatile memory cell includes the first nonvolatile memory element,
   wherein a second nonvolatile memory cell includes the second and third nonvolatile memory elements,
   wherein a rewriting frequency of the second nonvolatile memory cell is greater than a rewriting frequency of the first nonvolatile memory cell,
   wherein, in the first nonvolatile memory cell, one bit is formed from the first nonvolatile memory element,
   wherein, in the second nonvolatile memory cell, the second and third nonvolatile memory elements containing the same data are rewritten at a time of a rewriting operation of the second and third nonvolatile memory elements,
   wherein the first gate electrodes of the second and third nonvolatile memory elements are in common,
   wherein the source regions of the second and third nonvolatile memory elements are in common, and wherein the drain regions of the second and third nonvolatile memory elements are connected to a bit line formed over the first, second, and third nonvolatile memory elements.

7. The semiconductor device according to claim 6,
wherein the first gate electrode of each nonvolatile memory element extends in a first direction,
wherein the source region of each nonvolatile memory element extends in the first direction, and
wherein the bit line extends in a second direction perpendicular to the first direction.

8. The semiconductor device according to claim 6,
wherein the first gate electrode of each nonvolatile memory element is formed of a poly silicon film, and
wherein the source region of each nonvolatile memory element is formed of an impurity region formed in the semiconductor substrate.

9. The semiconductor device according to claim 6,
wherein each nonvolatile memory element further includes a second gate electrode formed over the semiconductor substrate via a gate insulating film,
wherein, in each of the first and second nonvolatile memory cells, the first and second gate electrodes are formed between the source and drain regions in a gate length direction.

10. The semiconductor device according to claim 6,
wherein the first nonvolatile memory cell is used for storing program data, and
wherein the second nonvolatile memory cell is used for storing processed data.

11. The semiconductor device according to claim 6,
wherein the charge storage film includes a silicon nitride film.

12. The semiconductor device according to claim 6,
wherein the charge storage film includes a silicon oxynitride film.

13. A semiconductor device comprising first, second and third nonvolatile memory elements each including a first gate electrode provided over a semiconductor substrate via a charge-storage film, a source region and a drain region,
wherein a first nonvolatile memory cell includes the first nonvolatile memory element,
wherein a second nonvolatile memory cell includes the second and third nonvolatile memory elements,
wherein a rewriting frequency of the second nonvolatile memory cell is greater than a rewriting frequency of the first nonvolatile memory cell,
wherein, in the first nonvolatile memory cell, one bit is formed from the first nonvolatile memory element,
wherein, in the second nonvolatile memory cell, the second and third nonvolatile memory elements containing the same data are rewritten at a time of a rewriting operation of the second and third nonvolatile memory elements,
wherein the first gate electrodes of the second and third nonvolatile memory elements are in common,
wherein the source regions of the second and third nonvolatile memory elements are in common,
wherein the drain region of the second nonvolatile memory element is coupled to a first bit line formed over the second nonvolatile memory element,
wherein the drain region of the third nonvolatile memory element is coupled to a second bit line formed over the third nonvolatile memory element, and
wherein the first and second bit lines are shunted by a metal interconnection formed in a layer different from that in which the first and second bit lines are formed.

14. The semiconductor device according to claim 13,
wherein the first gate electrode of each nonvolatile memory element extends in a first direction,
wherein the source region of each nonvolatile memory element extends in the first direction, and
wherein the bit line extends in a second direction perpendicular to the first direction.

15. The semiconductor device according to claim 13,
wherein each first gate electrode is formed of a poly silicon film, and
wherein each source region is formed of an impurity region formed in the semiconductor substrate.

16. The semiconductor device according to claim 13,
wherein the first, second and third nonvolatile memory elements each further includes a second gate electrode formed over the semiconductor substrate via a gate insulating film,
wherein, in each of the first and second nonvolatile memory cells, the first and second gate electrodes are formed between the source and drain regions in a gate length direction.

17. The semiconductor device according to claim 13,
wherein the first nonvolatile memory cell is used for storing program data, and
wherein the second nonvolatile memory cell is used for storing processed data.

18. The semiconductor device according to claim 13,
wherein the charge storage film includes a silicon nitride film.

19. The semiconductor device according to claim 13,
wherein the charge storage film includes a silicon oxynitride film.

* * * * *